(12) United States Patent
Matsuzaki

(10) Patent No.: US 9,275,987 B2
(45) Date of Patent: Mar. 1, 2016

(54) SEMICONDUCTOR DEVICE

(71) Applicant: SEMICONDUCTOR ENERGY LABORATORY CO., LTD., Atsugi-Shi, Kanagawa-Ken (JP)

(72) Inventor: Takanori Matsuzaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 58 days.

(21) Appl. No.: 14/208,008

(22) Filed: Mar. 13, 2014

(65) Prior Publication Data
US 2014/0264518 A1 Sep. 18, 2014

(30) Foreign Application Priority Data
Mar. 14, 2013 (JP) .................. 2013-051283

(51) Int. Cl.
| | |
|---|---|
| *G11C 5/14* | (2006.01) |
| *H01L 27/06* | (2006.01) |
| *G11C 14/00* | (2006.01) |
| *H01L 27/12* | (2006.01) |
| *H01L 21/8238* | (2006.01) |

(Continued)

(52) U.S. Cl.
CPC ........ *H01L 27/0629* (2013.01); *G11C 14/0054* (2013.01); *H01L 27/1225* (2013.01); *H01L 21/823807* (2013.01); *H01L 27/1108* (2013.01); *H01L 27/1156* (2013.01)

(58) Field of Classification Search
CPC .................................. G11C 11/41; G11C 5/14
USPC .................................................. 365/154, 226
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,127,702 | A | 10/2000 | Yamazaki et al. |

(Continued)

FOREIGN PATENT DOCUMENTS

| | | | |
|---|---|---|---|
| EP | 1737044 | A | 12/2006 |
| EP | 2226847 | A | 9/2010 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications", IEEE Transactions on Electron Devices, vol. 51, No. 11; pp. 1805-1810; Nov. 1, 2004.

(Continued)

*Primary Examiner* — Michael Tran
(74) *Attorney, Agent, or Firm* — Fish & Richardson P.C.

(57) ABSTRACT

An object is to provide a semiconductor device which can store data even after the application of power supply voltage is stopped, a manufacturing method thereof, or a driving method thereof. Data stored in a first circuit portion is transmitted to a second circuit portion, the data is stored in the second circuit portion in a period during which the application of power supply voltage is stopped, and data corresponding to the data is transmitted to the first circuit portion at the time of applying power supply voltage again. With such a configuration, a semiconductor device can store data even in a period during which the application of the power supply voltage is stopped. In particular, the second circuit portion includes a transistor including an oxide semiconductor, whereby the data can be accurately stored.

12 Claims, 15 Drawing Sheets

(51) Int. Cl.
  *H01L 27/11* (2006.01)
  *H01L 27/115* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,378,341 B2 | 2/2013 | Hayashi et al. |
| 8,400,817 B2 | 3/2013 | Yamazaki et al. |
| 8,410,838 B2 | 4/2013 | Kato et al. |
| 8,432,187 B2 | 4/2013 | Kato et al. |
| 8,547,771 B2 | 10/2013 | Koyama |
| 8,593,856 B2 | 11/2013 | Koyama et al. |
| 8,618,586 B2 | 12/2013 | Koyama et al. |
| 8,773,906 B2 | 7/2014 | Ohmaru |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025680 A1* | 2/2010 | Shino et al. ............ 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2012/0261734 A1* | 10/2012 | Saito ............ 257/296 |
| 2013/0057315 A1 | 3/2013 | Kato et al. |
| 2013/0134418 A1 | 5/2013 | Hayashi et al. |
| 2013/0222033 A1 | 8/2013 | Kato et al. |
| 2013/0234757 A1 | 9/2013 | Kato et al. |
| 2014/0204696 A1 | 7/2014 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-141230 A | 6/2010 |
| JP | 2012-257187 A | 12/2012 |
| WO | WO-2004/114391 | 12/2004 |

OTHER PUBLICATIONS

Woncham Kim et al.; "An Experimental High-Density DRAM Cell with a Built-in Gain Stage"; IEEE Journal of Solid-State Circuits, vol. 29, No. 8; pp. 978-981; Aug. 1, 1994.

Shoji Shukuri et al.; "A Complementary Gain Cell Technology for Sub-1V Supply DRAMs"; IEDM 92: Technical Digest of International Electron Devices Meeting; pp. 1006-1008; Dec. 13, 1992.

Shoji Shukuri et al.; "A Semi-Static Complementary Gain Cell Technology for Sub-1 V Supply DRAM's"; IEEE Transactions on Electron Devices, vol. 41, No. 6; pp. 926-931; Jun. 1, 1994.

(56) References Cited

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Sympoisum of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", Journal of the SID, 2007, vol. 15, No. 1, pp. 17-22.
Hosono.H et al., "Working hypothesis to explore novel wide band gap electrically conducting amorphous oxides and Examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Diegst '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Eng Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

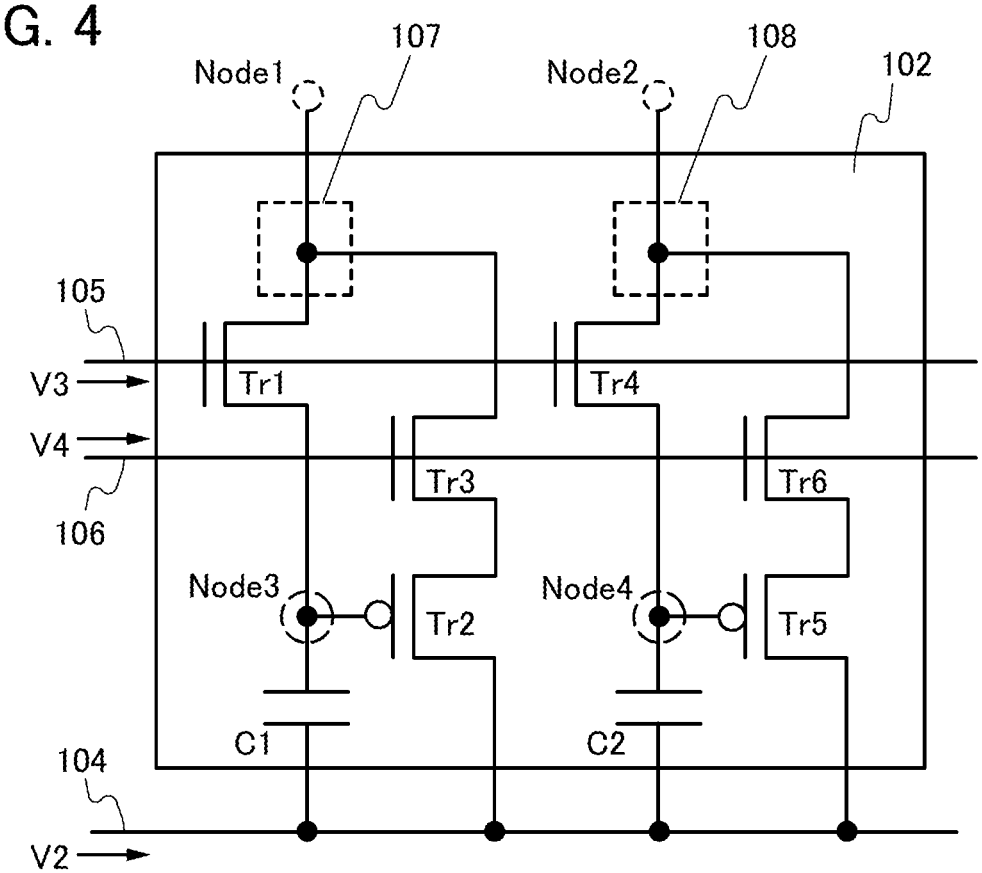

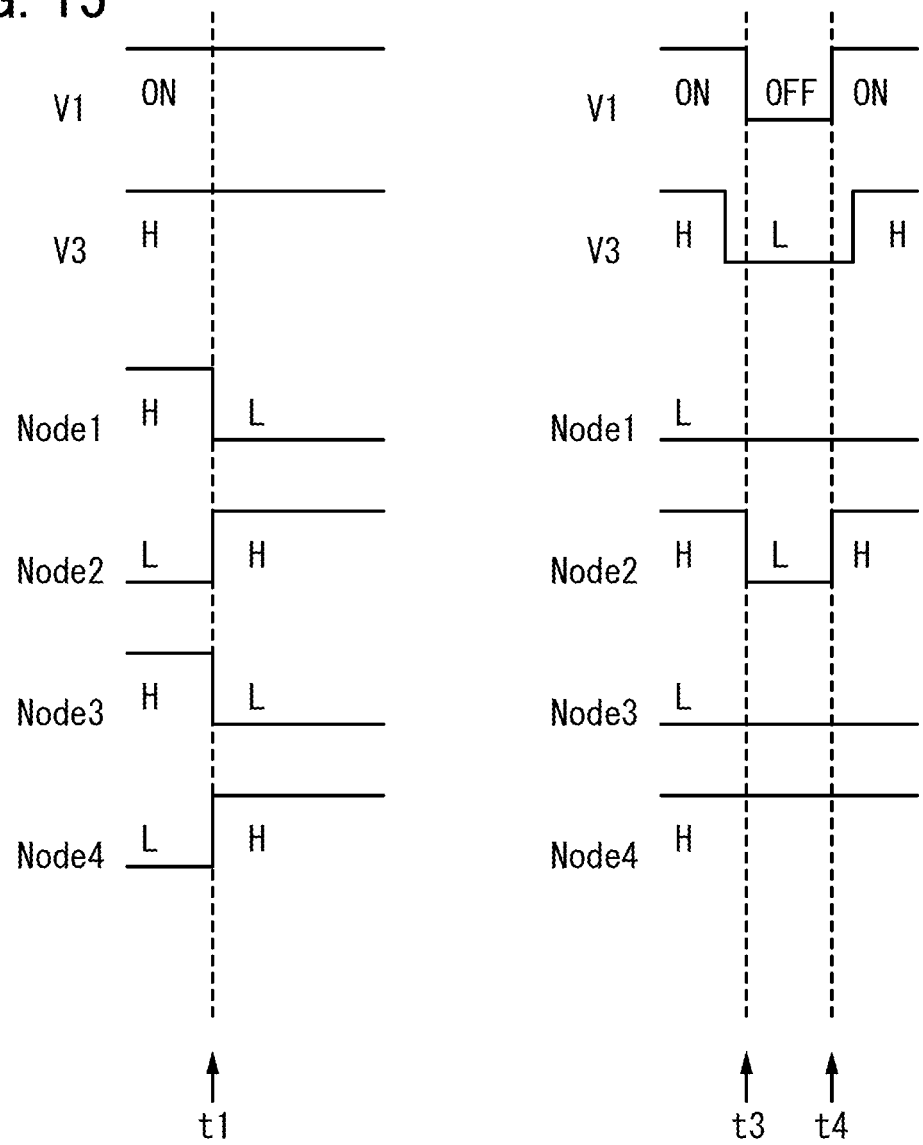

SEMICONDUCTOR DEVICE

BACKGROUND OF THE INVENTION

1. Field of the Invention

The present invention relates to an object, a method, or a manufacturing method. In particular, the present invention relates to, for example, a semiconductor device, a display device, a light-emitting device, a power storage device, a driving method thereof, or a manufacturing method thereof. The present invention relates to, for example, a semiconductor device, a display device, or a light-emitting device each including an oxide semiconductor.

2. Description of the Related Art

Patent Document 1 discloses a semiconductor device provided with a transistor including an oxide semiconductor layer over a semiconductor substrate provided with a MOS transistor. Patent Document 2 discloses that a transistor including an oxide semiconductor film has extremely low leakage current in an off state.

REFERENCE

Patent Document

[Patent Document 1] Japanese Published Patent Application No. 2010-141230
[Patent Document 2] Japanese Published Patent Application No. 2012-257187

SUMMARY OF THE INVENTION

An object of one embodiment of the present invention is to provide a novel semiconductor device, a manufacturing method thereof, or a driving method thereof. Another object of one embodiment of the present invention is to provide a semiconductor device with excellent characteristics, a manufacturing method thereof, or a driving method thereof.

Another object of one embodiment of the present invention is to provide a semiconductor device which can store data even after the application of power supply voltage is stopped, a manufacturing method thereof, or a driving method thereof. Another object of one embodiment of the present invention is to provide a semiconductor device whose occupation area is reduced, a manufacturing method thereof, or a driving method thereof. Another object of one embodiment of the present invention is to provide a semiconductor device whose operation speed is improved, a manufacturing method thereof, or a driving method thereof.

Note that the descriptions of these objects do not disturb the existence of other objects. In one embodiment of the present invention, there is no need to achieve all the objects. Other objects will be apparent from and can be derived from the description of the specification, the drawings, the claims, and the like.

In a semiconductor device of one embodiment of the present invention, data stored in a first circuit portion is transmitted to a second circuit portion, the data is stored in the second circuit portion in a period during which the application of power supply voltage is stopped, and data based on the data is transmitted to the first circuit portion at the time of applying power supply voltage again. With such a configuration, the semiconductor device can store data even in a period during which the application of the power supply voltage is stopped.

Further, the second circuit portion may include a node and a transistor including an oxide semiconductor. The first circuit portion may be electrically connected to the node through the transistor including the oxide semiconductor. The transistor including the oxide semiconductor has an extremely low off-state current value; thus, electric charge scarcely leaks through the transistor from the node. Data is transmitted from the second circuit portion to the first circuit portion based on data stored in the node. The semiconductor device can accurately store the data even in a period during which power supply voltage is applied. The oxide semiconductor has a wider bandgap than silicon, for example; thus, the off-state current value of the transistor including the oxide semiconductor can be extremely low.

A semiconductor device of one embodiment of the present invention includes a first circuit portion and a second circuit portion. The first circuit portion includes a first node and a second node. The second circuit portion includes first to sixth transistors and first and second capacitors. The first node is electrically connected to a gate of the second transistor and a first electrode of the first capacitor through the first transistor. The second node is electrically connected to a gate of the fifth transistor and a first electrode of the second capacitor through the fourth transistor. One of a source and a drain of the second transistor is electrically connected to the second node through the third transistor. One of a source and a drain of the fifth transistor is electrically connected to the first node through the sixth transistor. The first transistor and the fourth transistor each include an oxide semiconductor.

The first circuit portion includes a portion in which an even number of inverter circuits are circularly connected to each other.

According to one embodiment of the present invention, a novel semiconductor device and the like can be provided. Further, according to one embodiment of the present invention, it is possible to provide a semiconductor device and the like which can store data even after the application of power supply voltage is stopped.

Further, according to one embodiment of the present invention, it is possible to provide a semiconductor device whose occupation area is reduced. Further, according to one embodiment of the present invention, it is possible to provide a semiconductor device with improved operation speed.

BRIEF DESCRIPTION OF THE DRAWINGS

FIG. 1 illustrates an example of a semiconductor device or the like.
FIG. 2 shows an example of a timing chart or the like.
FIGS. 3A to 3C illustrate an example of a semiconductor device or the like.
FIG. 4 illustrates an example of a semiconductor device or the like.
FIGS. 5A and 5B illustrate examples of semiconductor devices or the like.
FIG. 6 illustrates an example of a semiconductor device or the like.
FIG. 7 shows an example of a timing chart or the like.
FIG. 8 illustrates an example of a semiconductor device or the like.
FIG. 9 illustrates an example of a semiconductor device or the like.
FIGS. 10A to 10F illustrate examples of semiconductor devices or the like.
FIGS. 11A and 11B illustrate examples of semiconductor devices or the like.
FIG. 12 illustrates an example of a semiconductor device or the like.

FIG. 13 illustrates an example of a semiconductor device or the like.

FIGS. 14A and 14B illustrate examples of semiconductor devices or the like.

FIG. 15 shows an example of a timing chart or the like.

DETAILED DESCRIPTION OF THE INVENTION

Figure 1:
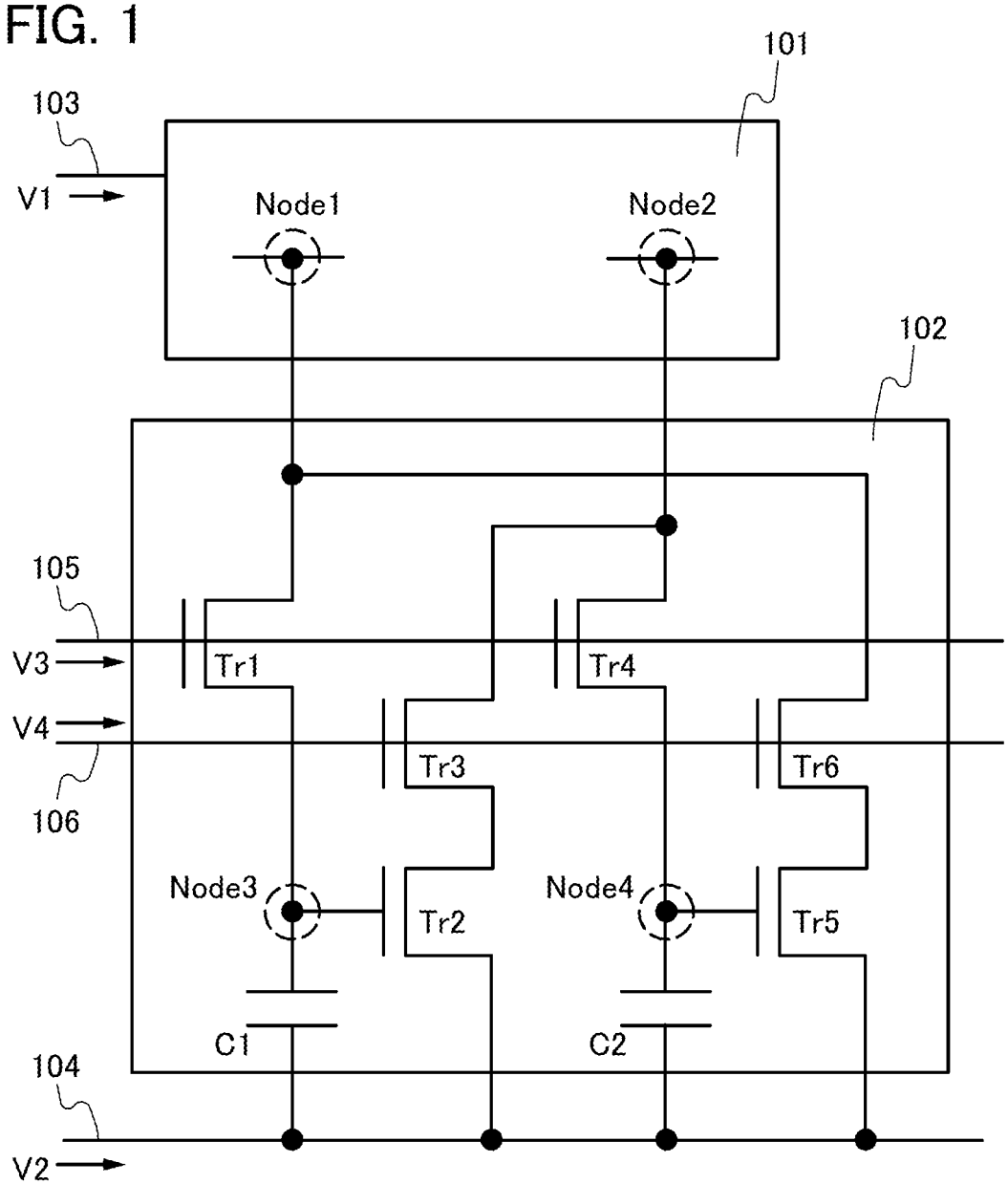

Embodiments of the present invention will be described below with reference to the drawings. Note that the present invention is not limited to the following description. It will be readily appreciated by those skilled in the art that various changes and modifications are possible without departing from the spirit and the scope of the present invention. Therefore, the present invention should not be construed as being limited to the following description of the embodiments. Note that in describing the structure of the present invention with reference to the drawing, reference numerals denoting the same portions are used in different drawings in common.

In this specification, the term "connection" means electrical connection and corresponds to a state where current, voltage, or a potential can be supplied or transmitted. Accordingly, a connection state means not only a state of direct connection but also a state of electrical connection through a circuit element such as a wiring, a resistor, a diode, or a transistor so that current, voltage, or a potential can be supplied or transmitted.

Although the block diagram attached to this specification shows components classified by their functions in independent blocks, it is difficult to classify actual components according to their functions completely, and it is possible for one component to have a plurality of functions.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that what is described (or part thereof) in one embodiment can be applied to, combined with, or exchanged with another content (or part thereof) in the same embodiment and/or what is described (or part thereof) in another embodiment or other embodiments.

Note that the size, the thickness of layers, or regions in diagrams are sometimes exaggerated for simplicity. Therefore, embodiments of the present invention are not limited to such a scale.

Note that drawings are schematic views of ideal examples, and the embodiments of the present invention are not limited to the shape or the value illustrated in the drawings. For example, the following can be included: variation in shape due to a manufacturing technique or dimensional deviation; or variation in signal, voltage, or current due to noise or difference in timing.

A voltage usually refers to a potential difference between a given potential and a reference potential (e.g., a source potential or a ground potential (GND)). A voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. In addition, the ordinal numbers in this specification do not denote particular names which specify the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

(Embodiment 1)

In this embodiment, an example of a semiconductor device is described. FIG. 1 illustrates an example of a semiconductor device.

A semiconductor device includes a first circuit portion 101 and a second circuit portion 102.

The first circuit portion 101 includes a first node Node 1 (also simply referred to as Node 1) and a second node Node 2 (also simply referred to as Node 2). The first circuit portion 101 is electrically connected to a first wiring 103. The first wiring 103 has a function of supplying a first potential V1 (also simply referred to as V1). The first potential V1 is power supply voltage applied to the first circuit portion 101. In this embodiment, V1 is set to Vdd; however, V1 is not limited thereto.

In the first circuit portion 101, in a period during which V1 is supplied, potentials can be held in Node 1 and Node 2. That is, the first circuit portion 101 functions as a storage circuit and can store data (also referred to as a signal).

Node 2 can hold a potential inverted from that of Node 1. For example, in the case where Node 1 can hold a 'H (High)'-level potential, Node 2 can hold a 'L (Low)'-level potential.

The second circuit portion 102 includes a third node Node 3 (also simply referred to as Node 3) and a fourth node Node 4 (also simply referred to as Node 4). Further, the second circuit portion 102 includes a first transistor Tr1 (also simply referred to as Tr1), a second transistor Tr2 (also simply referred to as Tr2), a third transistor Tr3 (also simply referred to as Tr3), a fourth transistor Tr4 (also simply referred to as Tr4), a fifth transistor Tr5 (also simply referred to as Tr5), a sixth transistor Tr6 (also simply referred to as Tr6), a first capacitor C1 (also simply referred to as C1), and a second capacitor C2 (also simply referred to as C2).

In FIG. 1, Tr1 to Tr6 are all n-channel transistors; however, a circuit configuration in which an n-channel transistor and a p-channel transistor are combined as appropriate can be employed. Further, the circuit configuration may be changed as appropriate by including a switching element (e.g., a transistor), another circuit (e.g., an inverter circuit), or the like between a transistor and a capacitor, between a transistor and a wiring, between a wiring and a capacitor, or the like. For example, a circuit configuration in which a switching element or an inverter circuit is included between Tr2 and a second wiring 104 to electrically connect Tr2 to the second wiring 104 may be employed.

In the semiconductor device of FIG. 1, Node 1 is electrically connected to one of a source and a drain of Tr1. The other of the source and the drain of Tr1 is electrically connected to a first electrode (also referred to as one electrode) of C1 and a gate of Tr2. That is, Node 1 is electrically connected to the one electrode of C1 and the gate of Tr2 through Tr1. One of a source and a drain of Tr2 is electrically connected to one of a source and a drain of Tr3. The other of the source and the drain of Tr3 is electrically connected to Node 2. That is, the one of the source and the drain of Tr2 is electrically connected to Node 2 through Tr3.

Node 2 is electrically connected to one of a source and a drain of Tr4. The other of the source and the drain of Tr4 is electrically connected to a first electrode of C2 and a gate of Tr5. That is, Node 2 is electrically connected to the one electrode of C2 and the gate of Tr5 through Tr4. One of a source and a drain of Tr5 is electrically connected to one of a source and a drain of Tr6. The other of the source and the drain of Tr6 is electrically connected to Node 1. That is, the one of the source and the drain of Tr5 is electrically connected to Node 1 through Tr6.

In FIG. 1, a point at which the other of the source and the drain of Tr1, the first electrode of C1, and the gate of Tr2 are connected to each other is referred to as a third node (Node 3). Further, a point at which the other of the source and the drain of Tr4, the first electrode of C2, and the gate of Tr5 are connected to each other is referred to as a fourth node (Node 4).

A second electrode (also referred to as the other electrode) of C1, the other of the source and the drain of Tr2, a second electrode of C2, and the other of the source and the drain of Tr5 are electrically connected to the second wiring 104. The second wiring 104 has a function of supplying a second potential V2 (also simply referred to as V2). In this embodiment, V2 is set to Vss; however, V2 is not limited thereto and may be set as appropriate in accordance with the circuit configuration. For example, V2 may be set to Vdd. Further, V2 is not necessarily fixed and may be variable. Note that Vdd and Vss each represent power supply voltage and Vdd>Vss. Further, Vss can be set to, for example, a ground potential; however, Vss is not limited thereto.

A gate of Tr1 and a gate of Tr4 are electrically connected to a third wiring 105. The third wiring 105 has a function of supplying a third potential V3 (also simply referred to as V3). By supplying V3, conduction (also referred to as an on state) and non-conduction (also referred to as an off state) of Tr1 are controlled. Further, conduction and non-conduction of Tr4 are controlled by supplying V3. Note that the gate of Tr1 and the gate of Tr4 may be electrically connected to different wirings.

A gate of Tr3 and a gate of Tr6 are electrically connected to a fourth wiring 106. The fourth wiring 106 has a function of supplying a fourth potential V4 (also simply referred to as V4). By supplying V4, conduction and non-conduction of Tr3 are controlled. Further, conduction and non-conduction of Tr6 are controlled by supplying V4. Note that the gate of Tr3 and the gate of Tr6 may be electrically connected to different wirings.

The potential of Node 3 controls conduction and non-conduction of Tr2. The potential of Node 4 controls conduction and non-conduction of Tr5.

In the second circuit portion 102, in a period during which Tr1 and Tr4 are in non-conduction states, potentials can be held in Node 3 and Node 4. That is, the second circuit portion 102 functions as a storage circuit and can store data.

In one embodiment of the present invention, such a novel semiconductor device as illustrated in FIG. 1 can be provided.

The configuration of a semiconductor device in one embodiment of the present invention is not limited to the circuit configuration in FIG. 1. For example, C1 and C2 do not need to be provided. Further, gate capacitance of Tr2 and Tr5 may be used instead of C1 and C2. Connection relations among Tr2, Tr3, Tr4, Tr5, and Tr6 may be changed as appropriate.

Further, the second electrode of C1, the second electrode of C2, the other of the source and the drain of Tr2, and the other of the source and the drain of Tr5 may be electrically connected to different wirings.

Alternatively, the second electrode of C1 and the second electrode of C2 may be electrically connected to one wiring, and the other of the source and the drain of Tr2 and the other of the source and the drain of Tr5 may be electrically connected to another wiring. Alternatively, the second electrode of C1 and the other of the source and the drain of Tr2 may be electrically connected to one wiring, and the second electrode of C2 and the other of the source and the drain of Tr5 may be electrically connected to another wiring. Alternatively, the second electrode of C1 and the other of the source and the drain of Tr5 may be electrically connected to one wiring, and the second electrode of C2 and the other of the source and the drain of Tr2 may be electrically connected to another wiring.

Figure 2:
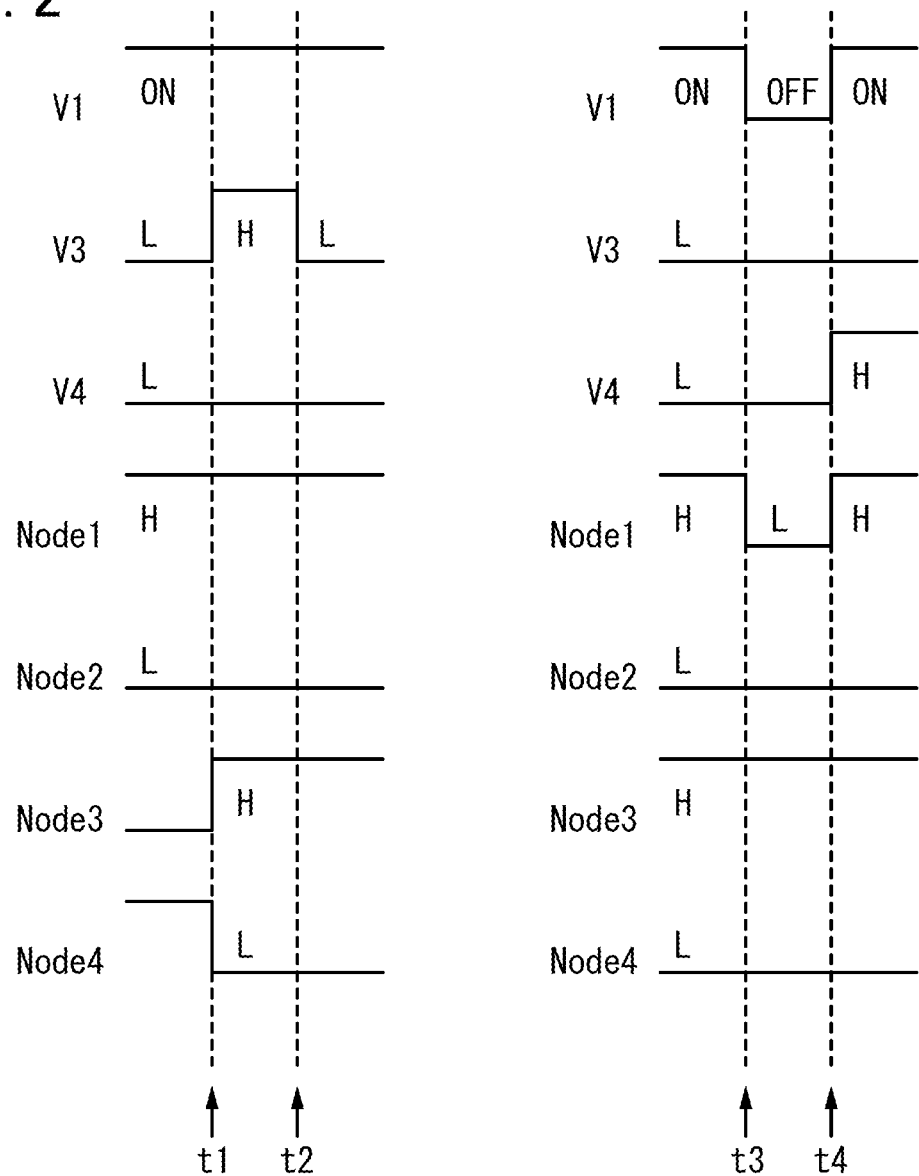

Next, a method for operating the semiconductor device of FIG. 1 is described. FIG. 2 is a timing chart in the operation of the semiconductor device of FIG. 1. The semiconductor device of FIG. 1 has functions of (1) writing operation before the application of power supply voltage is stopped, (2) operation of stopping the application of power supply voltage, and (3) operation of applying power supply voltage again.

The operation is not limited to the operations (1), (2), and (3), and another operation can be performed before or after each operation. For example, before the operation (1), an operation of inputting a potential for initialization to Node 3 or Node 4 may be performed. In this case, Node 3 or Node 4 may be electrically connected to a wiring which can supply the initialization potential. A switching element or the like may be provided between Node 3 or Node 4 and the wiring. Further, at least one of the operations (1), (2), and (3) may be omitted.

In this example, the application of power supply voltage (also simply referred to as power supply) refers to supply of V1 to the first circuit portion 101, and is also expressed that power supply is powered on or V1 is turned on. Further, stopping application of power supply voltage refers to stopping supply of V1 to the first circuit portion 101, and is also expressed that power supply is stopped or V1 is turned off. Further, supplying power again after the stop of power supply is also expressed that power supply is resumed.

First, (1) writing operation before the application of power supply voltage is stopped (also simply referred to as writing operation) is described.

At timing t1 (also simply referred to as t1) in FIG. 2, V3 is set to 'H', whereby Tr1 and Tr4 are turned on. As a result, a potential corresponding to the potential of Node 1 ('H' in this example) is input to Node 3. Further, a potential corresponding to the potential of Node 2 ('L' in this example) is input to Node 4. That is, data stored in Node 1 is transmitted to Node 3 through Tr1. Further, data stored in Node 2 is transmitted to Node 4 through Tr4. In this example, V4 is set to 'L'.

Then, at timing t2 (also simply referred to as t2) in FIG. 2, V3 is set to 'L', whereby Tr1 and Tr4 are turned off. As a result, potentials are held in Node 3 and Node 4. That is, the data in Node 1 is written to Node 3 and the data in Node 2 is written to Node 4. As described above, in a period between t1 and t2, Tr1 and Tr4 are turned on and writing operation is performed.

Tr2 is turned on based on the potential held in Node 3 ('H' in this example) by the writing operation. On the other hand, Tr5 is turned off based on the potential held in Node 4 ('L' in this example).

Next, (2) operation of stopping the application of power supply voltage (also referred to as stopping operation) is described.

At timing t3 (also simply referred to as t3) in FIG. 2, V1 is turned off. In other words, the application of power supply voltage to the first circuit portion 101 is stopped. As a result, in the first circuit portion 101, the potential of Node 1 is lowered.

At this time, Tr1 is in a non-conduction state; thus, charge transfer through Tr1 is suppressed. That is, the potential of Node 3 is held. Similarly, Tr4 is in a non-conduction state; thus, charge transfer through Tr4 is suppressed. That is, the potential of Node 4 is held. As described above, the semiconductor device can store data even in a period during which the application of power supply voltage is stopped.

Next, (3) operation of applying power supply voltage again (also referred to as resuming operation) is described.

At timing t4 (also simply referred to as t4) in FIG. 2, V1 is turned on. In other words, power supply voltage is applied to the first circuit portion 101 again.

At the same time as t4, V4 is set to 'H', whereby Tr3 and Tr6 are turned on. Timing when V4 is set to 'H' does not need to be the same time as t4, and V4 may be set to 'H' before V1 is turned on (before t4). By turning on Tr3 and Tr6 before V1 is turned on, resuming operation can be performed at higher speed in some cases, which is preferable.

As a result of making Tr3 be in a conduction state, the second wiring 104 is electrically connected to Node 2 through Tr2 and Tr3 which are each in a conduction state. Then, a potential corresponding to V2 ('L' in this example) is input to Node 2. The potential of Node 1 is a potential inverted from that of Node 2; thus, a potential at 'H' level is input to Node 1. That is, potentials corresponding to the potentials held in Node 1 and Node 2 before the application of power supply voltage is stopped are input to Node 1 and Node 2. Because Tr5 is in a non-conduction state, the second wiring 104 is not electrically connected to Node 1.

In this embodiment, Node 1 is set to 'H' and Node 2 is set to 'L'; however, these potentials may be reversed to each other. In this case, 'H' is held in Node 4 at the time of the writing operation and Tr5 is turned on. At the time of the resuming operation, the second wiring 104 is electrically connected to Node 1 through Tr5 and Tr6. Then, 'L' is input to Node 1 and an inverted potential 'H' is input to Node 2, so that the potentials are at levels before the application of power supply voltage is stopped.

Note that the potentials input to the gates of Tr1, Tr3, Tr4, and Tr6 are not limited to the above. These potentials may be changed as appropriate in accordance with the circuit configuration. For example, the potentials input to the gates of Tr3 and Tr6 may be different. In this case, a configuration in which a circuit (e.g., an inverter circuit) is provided between the gate of Tr3 and the gate of Tr6 so that the potential of Tr6 is inverted from that of Tr3, a configuration in which Tr3 has n-type conductivity and Tr6 has p-type conductivity, and the like are given. Similarly, a variety of configurations can also be applied to Tr1 and Tr4.

As described above, in the semiconductor device of this embodiment, data stored in the first circuit portion 101 is transmitted to the second circuit portion 102 (writing operation), the data is stored in the second circuit portion 102 in a period during which the application of power supply voltage is stopped (stopping operation), and data based on the data is transmitted to the first circuit portion 101 at the time of applying power supply voltage again (resuming operation). With such a configuration, a semiconductor device can store data even in a period during which the application of the power supply voltage is stopped.

For Tr1 to Tr6, any of a variety of semiconductors such as a semiconductor containing a semiconductor belonging to Group 14 of the periodic table (e.g., silicon), an organic semiconductor, a compound semiconductor, and an oxide semiconductor can be used. Moreover, an amorphous semiconductor, a microcrystalline semiconductor, a polycrystalline semiconductor, a single crystal semiconductor, or the like can be used.

In particular, Tr1 and Tr4 each preferably include an oxide semiconductor. In a transistor including an oxide semiconductor, which has extremely lower off-state current than a transistor including another semiconductor, potentials are extremely favorably held in Node 3 and Node 4. The oxide semiconductor has a wider bandgap than silicon, for example; thus, the off-state current value of the transistor including the oxide semiconductor can be extremely low. Note that one of or both Tr1 and Tr4 may include an oxide semiconductor.

Further, Tr2, Tr3, Tr5, and Tr6 each preferably include silicon. In a transistor including silicon, mobility and on-state current can be improved compared to in a transistor including another semiconductor; thus, the operation speed of the semiconductor device can be improved. In this case, particularly, the transistor preferably includes a single crystal semiconductor. The operation speed of Tr3 and Tr6 may affect, in particular, the resuming operation; thus, Tr3 and Tr6 each preferably include silicon. Further, one or more of Tr2, Tr3, Tr5, and Tr6 may include silicon.

In the case where Tr1 and Tr4 each include an oxide semiconductor, Tr2, Tr3, Tr5, and Tr6 each preferably include silicon. In this case, a transistor including an oxide semiconductor (also referred to as OS-Tr) can be stacked over a transistor including silicon (also referred to as Si-Tr); thus, occupation area of the semiconductor device can be reduced. Note that one of or both Tr1 and Tr4 may include an oxide semiconductor. Further, one or more of Tr2, Tr3, Tr5, and Tr6 may include silicon. Alternatively, even in the case where the Si-Tr is provided over the OS-Tr, the occupation area of the semiconductor device can be reduced.

In addition, Tr2, Tr3, Tr5, and Tr6 each preferably include an oxide semiconductor. For example, in the case where the first circuit portion 101 includes a transistor including silicon, a transistor including an oxide semiconductor can be stacked over the transistor including silicon; thus, the occupation area of the semiconductor device can be reduced. Note that one or more of Tr2, Tr3, Tr5, and Tr6 may include an oxide semiconductor.

Examples of a transistor using a single crystal semiconductor are a bulk transistor using a single crystal semiconductor substrate and a thin film transistor using an SOI substrate. As a base substrate for the SOI substrate, a glass substrate or a semiconductor substrate can be used, for example. An example of a transistor using an amorphous semiconductor, a microcrystalline semiconductor, or a polycrystalline semiconductor is a thin film transistor provided over a glass substrate, a semiconductor substrate, or the like.

In the case where Tr1 and Tr4 each include an oxide semiconductor and Tr2, Tr3, Tr5, and Tr6 each include silicon, the operation speed of the transistor including an oxide semiconductor may be slower than that of the transistor including silicon. In this case, it is effective to make the channel width of each of Tr1 and Tr4 larger than that of each of Tr2, Tr3, Tr5, and Tr6 in order to improve the current drive capability of Tr1 and Tr4. The channel length of each of Tr1 and Tr4 may be shorter than that of each of Tr2, Tr3, Tr5, and Tr6.

By improving the operation speed of Tr2, Tr3, Tr5, and Tr6, resuming operation can be favorably performed. In this case, the channel width of each of Tr2, Tr3, Tr5, and Tr6 is preferably larger than that of each of Tr1 and Tr4, for example. Further, in the case where the first circuit portion 101 includes a transistor, the channel width of each of Tr2, Tr3, Tr5, and Tr6 is preferably larger than that of the transistor in the first circuit portion 101. Further, the channel length of each of Tr2, Tr3, Tr5, and Tr6 may be shorter than that of each of Tr1 and Tr4 or that of the transistor in the first circuit portion 101. In particular, in the case where Tr2, Tr3, Tr5, and Tr6 each include an oxide semiconductor, the operation speed of these transistors may be slow; thus, the sizes of these transistors are preferably designed as described above.

Note that an example of the transistor including an oxide semiconductor is described in detail in another embodiment. Further, an example in which the transistor including an oxide semiconductor and the transistor including silicon are stacked is also described in detail in another embodiment.

Part or the whole of this embodiment can be freely combined with part or the whole of another embodiment.

(Embodiment 2)

Figure 3A:
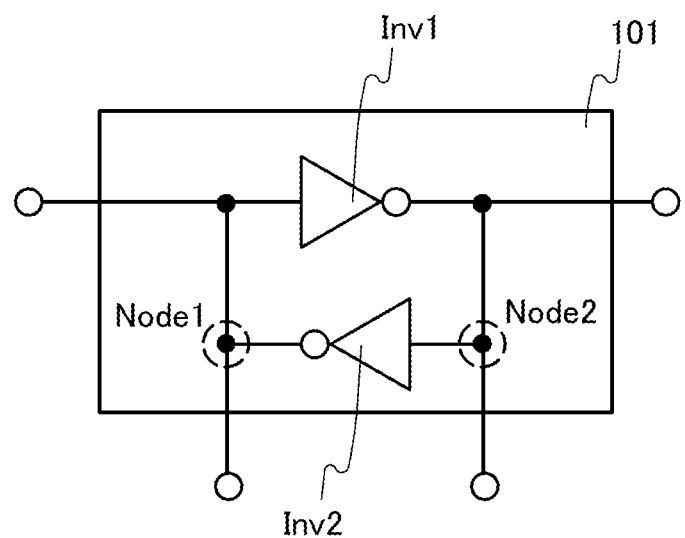
Figure 3B:
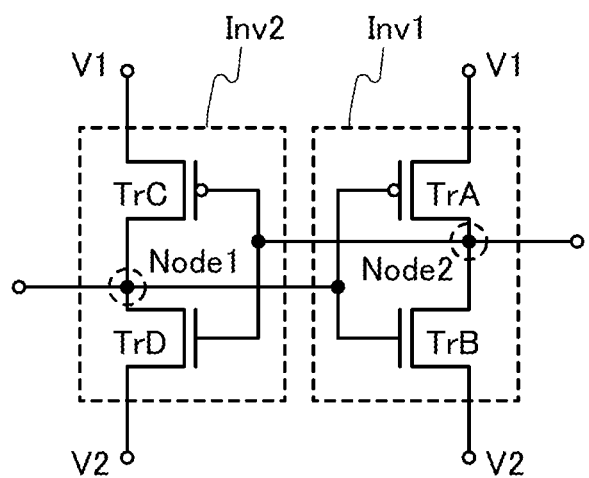
Figure 3C:
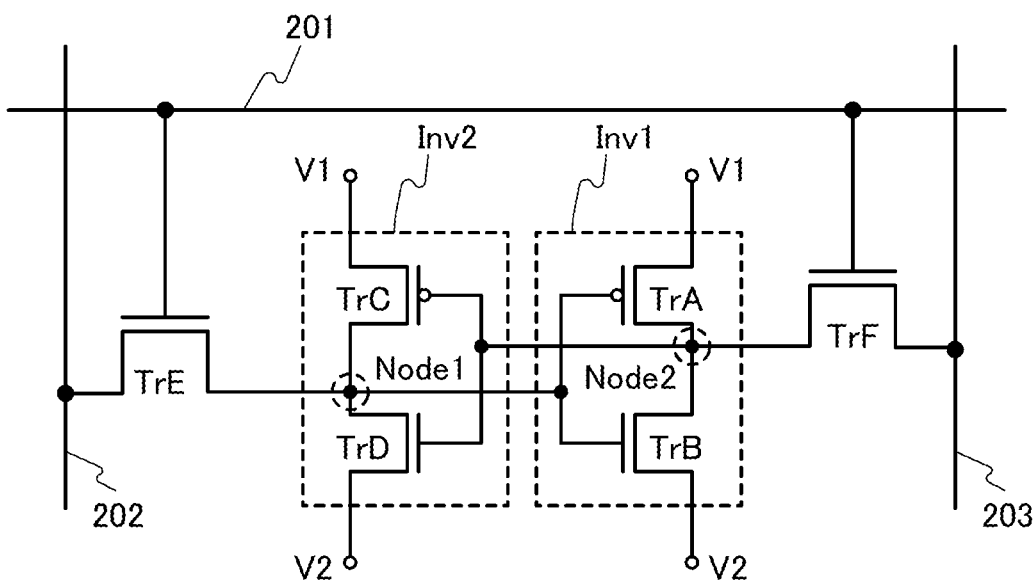

In this embodiment, an example of a semiconductor device is described. FIGS. 3A to 3C illustrate an example of a semiconductor device.

FIG. 3A shows an example of the first circuit portion 101. FIG. 3B shows an example of a specific circuit configuration of FIG. 3A.

The first circuit portion 101 includes a first inverter circuit Inv1 (also simply referred to as Inv1) and a second inverter circuit Inv2 (also simply referred to as Inv2).

An output terminal of Inv1 is electrically connected to an input terminal of Inv2. Further, an output terminal of Inv2 is electrically connected to an input terminal of Inv1.

As illustrated in FIG. 3B, Inv1 includes a transistor TrA (also simply referred to as TrA) and a transistor TrB (also simply referred to as TrB). Further, Inv2 includes a transistor TrC (also simply referred to as TrC) and a transistor TrD (also simply referred to as TrD).

The input terminal of Inv1 is electrically connected to a gate of TrA and a gate of TrB. One of a source and a drain of TrA is electrically connected to a wiring which has a function of supplying V1. The other of the source and the drain of TrA and one of a source and a drain of TrB are electrically connected to the output terminal of Inv1. The other of the source and the drain of TrB is electrically connected to a wiring which has a function of supplying V2.

The input terminal of Inv2 is electrically connected to a gate of TrC and a gate of TrD. One of a source and a drain of TrC is electrically connected to a wiring which has a function of supplying V1. The other of the source and the drain of TrC and one of a source and a drain of TrD are electrically connected to the output terminal of Inv2. The other of the source and the drain of TrD is electrically connected to a wiring which has a function of supplying V2.

Node 1 (also corresponding to Node 1 in other drawings) is a point at which the input terminal of Inv1 and the output terminal of Inv2 are connected to each other. Node 2 (also corresponding to Node 2 in other drawings) is a point at which the output terminal of Inv1 and the input terminal of Inv2 are connected to each other.

In the circuit of FIGS. 3A to 3C, when Node 1 is at a 'H' level, Node 2 is at a 'L' level, and in a period during which power supply voltage (V1 and V2) is applied, Node 1 and Node 2 are held at these levels. In contrast, when Node 1 is at a 'L' level, Node 2 is at a 'H' level. The circuit of FIGS. 3A to 3C is an example of a latch circuit which stores data by such an operation. Further, such a circuit as illustrated in FIGS. 3A to 3C is referred to as an inverter loop circuit. The inverter loop circuit includes an even number of inverter circuits and a circuit portion in which the inverter circuits are circularly connected to each other. Note that the inverter loop circuit may have a structure in addition to the circuit portion.

In such a circuit as illustrated in FIGS. 3A to 3C, normally, when the application of power supply voltage is stopped, it is difficult to hold the potentials of Node 1 and Node 2. Thus, such a circuit as illustrated in FIGS. 3A to 3C is applied to the first circuit portion 101 in FIG. 1 and the writing operation, the stopping operation, and the resuming operation are performed, whereby data can be stored even in a period during which the application of power supply voltage is stopped.

Note that the first circuit portion 101 is not limited to such an inverter loop circuit as illustrated in FIGS. 3A to 3C, and another latch circuit, any of a variety of storage circuits, or the like can be applied to the first circuit portion 101.

Further, semiconductor materials and the like of TrA, TrB, TrC, and TrD may be selected from the semiconductor materials and the like of Tr1 to Tr6 and the like described in another embodiment as appropriate. In particular, a transistor including silicon can improve the operation speed of the semiconductor device. In this case, particularly, single crystal silicon is preferably included.

FIG. 3C shows an example of the first circuit portion 101. The input terminal of Inv1 is electrically connected to one of a source and a drain of a transistor TrE (also simply referred to as TrE). The other of the source and the drain of TrE is electrically connected to a wiring 202. That is, the input terminal of Inv1 is electrically connected to the wiring 202 through TrE. The wiring 202 functions as a first bit line and has a function of transmitting data. That is, the wiring 202 can supply a potential to Node 1.

The input terminal of Inv2 is electrically connected to one of a source and a drain of a transistor TrF (also simply referred to as TrF). The other of the source and the drain of TrF is electrically connected to a wiring 203. That is, the input terminal of Inv2 is electrically connected to the wiring 203 through TrF. The wiring 203 functions as a second bit line and has a function of transmitting data. That is, the wiring 202 can supply a potential to Node 2. Note that the wiring 203 has a function of supplying a potential inverted from that of the wiring 202.

A gate of TrE and a gate of TrF are electrically connected to the wiring 201. The wiring 201 functions as a word line and can control conduction and non-conduction of TrE and TrF.

Part or the whole of this embodiment can be freely combined with part or the whole of another embodiment.

(Embodiment 3)

In this embodiment, an example of a semiconductor device is described. FIG. 4 illustrates an example of a semiconductor device.

A circuit of FIG. 4 is different from the circuit of FIG. 1 in that connection relations indicated by a dashed line 107 and a dashed line 108 are included. Specifically, the other of the source and the drain of Tr3 is electrically connected to Node 1 (the dashed line 107). Further, the other of the source and the drain of Tr6 is electrically connected to Node 2 (the dashed line 108). Other connection relations and the like are similar to those in FIG. 1.

According to this embodiment, the semiconductor device including such a novel circuit configuration as illustrated in FIG. 4 can be provided. Further, the circuit of FIG. 4 is effective because, by including the connection relations indicated by the dashed line 107 and the dashed line 108, intersection portions of a wiring, an electrode, and the like can be reduced and the lengths of the wiring, the electrode, and the like can be shortened as compared to the circuit of FIG. 1.

In the circuit of FIGS. 4, Tr2 and Tr5 each have p-type conductivity. Thus, when Node 1 is 'L', 'L' is written to Node 3 by the writing operation, so that Tr2 is turned on. On the other hand, Node 2 is 'H' and 'H' is written to Node 4, so that Tr5 is turned off. Then, through the stopping operation and the resuming operation, V2 (e.g., Vss='L' level) is input to Node 1. Then, a potential inverted from that of Node 1 ('H' level) is input to Node 2. As a result, Node 1 is 'L' which corresponds to data before power supply stop and Node 2 is 'H' which also corresponds to data before power supply stop.

In FIGS. 4, Tr2 and Tr5 each have p-type conductivity; however, an n-channel transistor and a p-channel transistor can be combined in accordance with the circuit configuration.

Further, the semiconductor materials, the structures, the designs of the sizes, and the like of Tr1 to Tr6 are the same as those in other embodiments.

As described above, in the semiconductor device of this embodiment, data stored in the first circuit portion 101 is transmitted to the second circuit portion 102 (writing operation), the data is stored in the second circuit portion 102 in a period during which the application of power supply voltage is stopped (stopping operation), and data based on the data is transmitted to the first circuit portion 101 at the time of applying power supply voltage again (resuming operation). With such a configuration, a semiconductor device can store data even in a period during which the application of the power supply voltage is stopped.

Part or the whole of this embodiment can be freely combined with part or the whole of another embodiment.

(Embodiment 4)

Figure 5A:
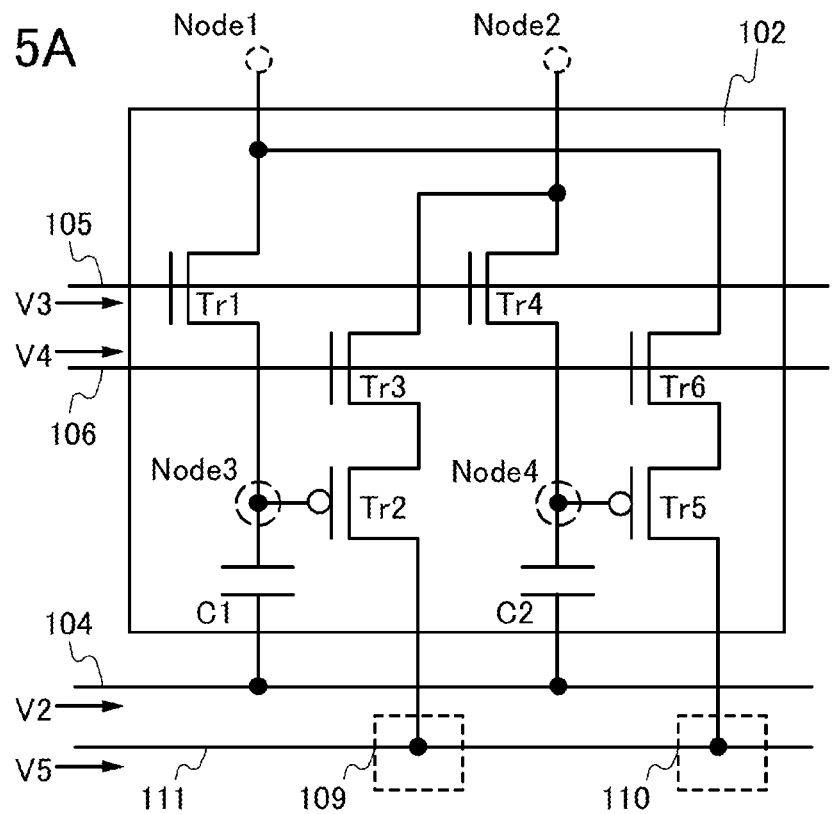
Figure 5B:
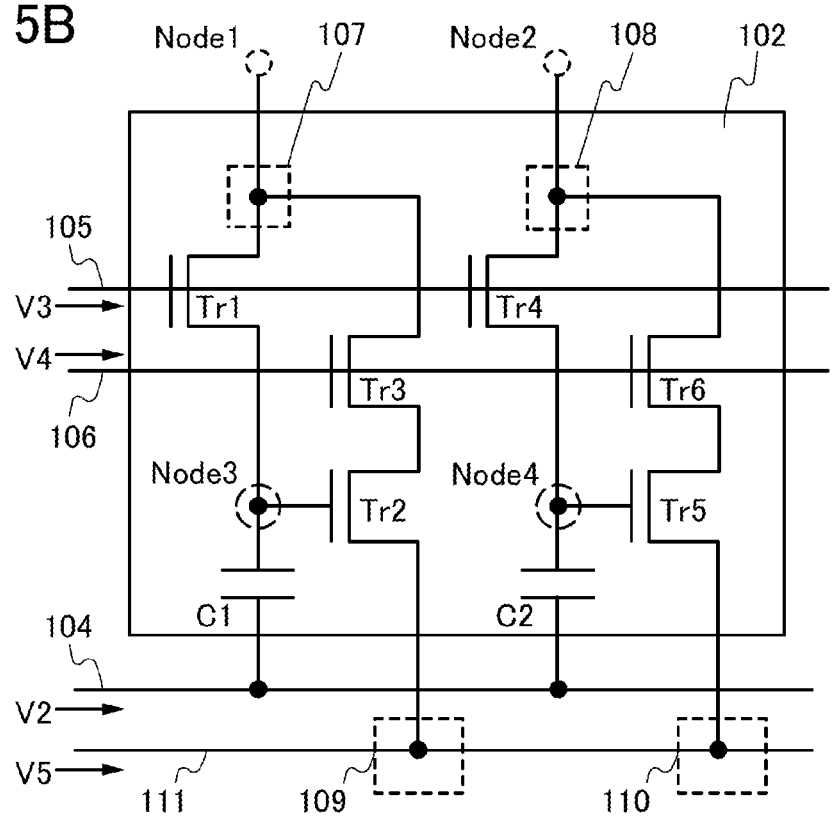

In this embodiment, an example of a semiconductor device is described. FIGS. 5A and 5B illustrate examples of a semiconductor device.

A circuit of FIG. 5A is different from the circuit of FIG. 1 in that connection relations indicated by a dashed line 109 and a dashed line 110 are included. Specifically, the other of the source and the drain of Tr2 is electrically connected to a fifth wiring 111 (the dashed line 109). Further, the other of the source and the drain of Tr5 is electrically connected to the fifth wiring 111 (the dashed line 110). Other connection relations and the like are similar to those in FIG. 1. The fifth wiring 111 has a function of supplying a fifth potential V5 (also simply referred to as V5). The fifth potential V5 is set to Vdd in this embodiment; however, V5 is not limited thereto. V5 may be set to Vss. Note that V5 may be a fixed potential or may be variable.

In the circuit of FIG. 5A, Tr2 and Tr5 each have p-type conductivity. Thus, when Node 1 is 'L', 'L' is written to Node 3 by the writing operation, so that Tr2 is turned on. On the other hand, Node 2 is 'H' and 'H' is written to Node 4, so that Tr5 is turned off. Then, through the stopping operation and the resuming operation, V5 (e.g., Vdd='H' level) is input to Node 2. Then, a potential inverted from that of Node 2 ('L' level) is input to Node 1. As a result, Node 1 is 'L' which corresponds to data before power supply stop and Node 2 is 'H' which also corresponds to data before power supply stop.

In FIG. 5A, Tr2 and Tr5 each have p-type conductivity; however, an n-channel transistor and a p-channel transistor can be combined in accordance with the circuit configuration.

A circuit of FIG. 5B is different from the circuit of FIG. 4 in that connection relations indicated by a dashed line 109 and a dashed line 110 are included. Specifically, the other of the source and the drain of Tr2 is electrically connected to a fifth wiring 111 (the dashed line 109). Further, the other of the source and the drain of Tr5 is electrically connected to the fifth wiring 111 (the dashed line 110). Other connection relations and the like are similar to those in FIG. 4. The fifth wiring 111 has a function of supplying V5. The fifth potential V5 is set to Vdd in this embodiment; however, V5 is not limited thereto. V5 may be set to Vss. Note that V5 may be a fixed potential or may be variable.

In the circuit of FIG. 5B, Tr2 and Tr5 each have n-type conductivity. Thus, when Node 1 is 'H', 'H' is written to Node 3 by writing operation, so that Tr2 is turned on. On the other hand, Node 2 is 'L' and 'L' is written to Node 4, so that Tr5 is turned off. Then, through the stopping operation and the resuming operation, V5 (e.g., Vdd='H' level) is input to Node 1. Then, a potential inverted from that of Node 1 ('L' level) is input to Node 2. As a result, Node 1 is 'H' which corresponds to data before power supply stop and Node 2 is 'L' which also corresponds to data before power supply stop.

In FIG. 5B, Tr2 and Tr5 each have n-type conductivity; however, an n-channel transistor and a p-channel transistor can be combined in accordance with the circuit configuration.

Further, the semiconductor materials, the structures, the designs of the sizes, and the like of Tr1 to Tr6 are the same as those in other embodiments.

Note that the other of the source and the drain of Tr2 and the other of the source and the drain of Tr5 may be electrically connected to different wirings.

According to this embodiment, the semiconductor device including such a novel circuit configuration as illustrated in FIG. 5A or FIG. 5B can be provided. Further, the circuit of FIG. 5B is effective because, by including the connection relations indicated by the dashed line 107 and the dashed line 108, intersection portions of a wiring, an electrode, and the like can be reduced and the lengths of the wiring, the electrode, and the like can be shortened as compared to the circuit of FIG. 5A.

Moreover, in the semiconductor device of this embodiment, data stored in the first circuit portion 101 is transmitted to the second circuit portion 102 (writing operation), the data is stored in the second circuit portion 102 in a period during which the application of power supply voltage is stopped (stopping operation), and data based on the data is transmitted to the first circuit portion 101 at the time of applying power supply voltage again (resuming operation). With such a configuration, a semiconductor device can store data even in a period during which the application of the power supply voltage is stopped.

Part or the whole of this embodiment can be freely combined with part or the whole of another embodiment.

(Embodiment 5)

Figure 6:
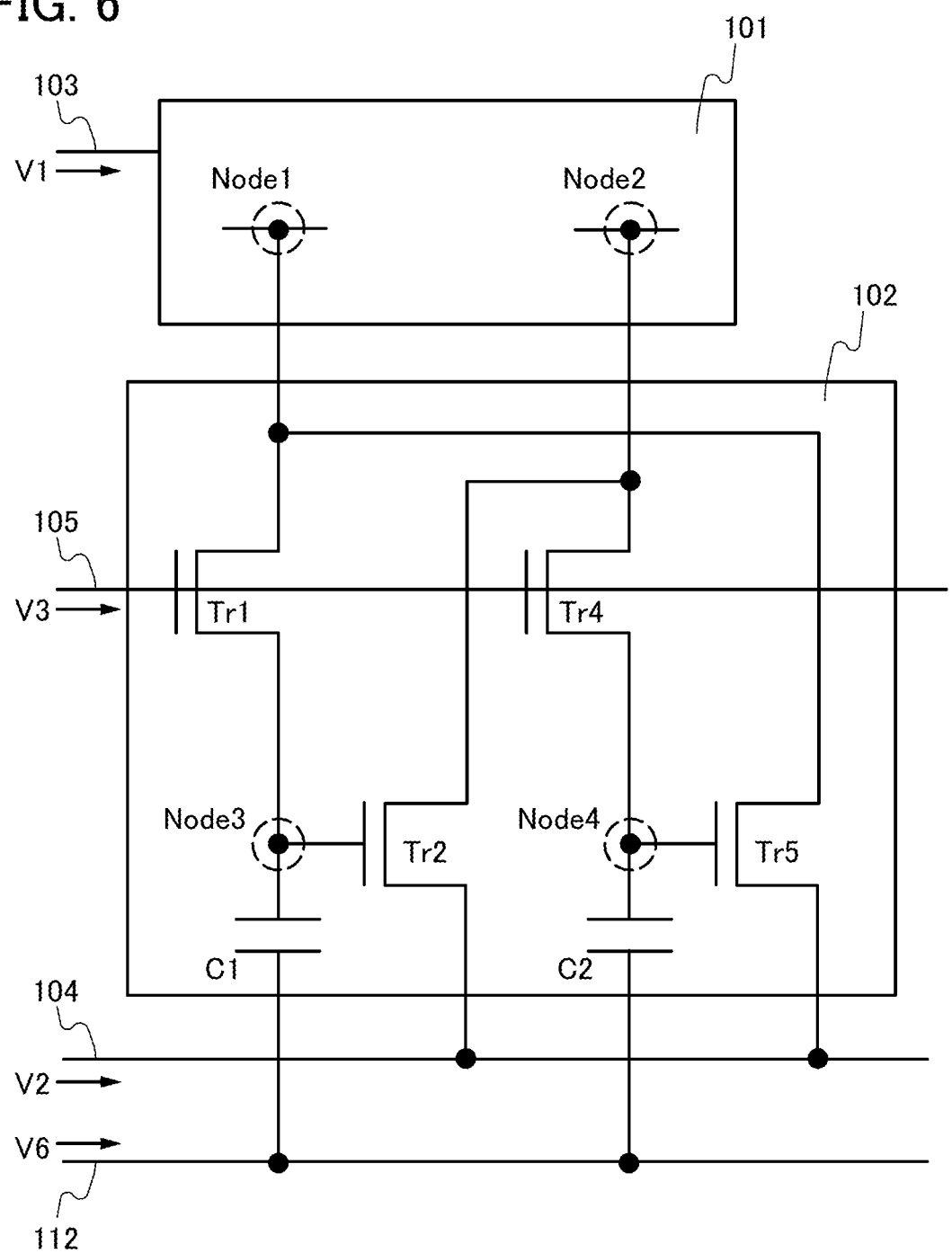

In this embodiment, an example of a semiconductor device is described. FIG. 6 illustrates one example of the semiconductor device.

A circuit of FIG. 6 is different from the circuit of FIG. 1 in that Tr3 and Tr6 are not provided. Specifically, one of the source and the drain of Tr2 is electrically connected to Node 2. That is, the second wiring 104 is electrically connected to Node 2 through Tr2. Further, one of the source and the drain of Tr5 is electrically connected to Node 1. That is, the second wiring 104 is electrically connected to Node 1 through Tr5.

Moreover, the circuit of FIG. 6 is different from the circuit of FIG. 1 in that the second electrode of C1 and the second electrode of C2 are electrically connected to a sixth wiring 112. In this embodiment, a sixth potential V6 (also simply referred to as V6) of the sixth wiring 112 is variable; however, V6 may be a fixed potential. Alternatively, V6 may be set to Vdd or Vss. The second electrode of C1 and the second electrode of C2 may be electrically connected to different wirings.

Figure 7:
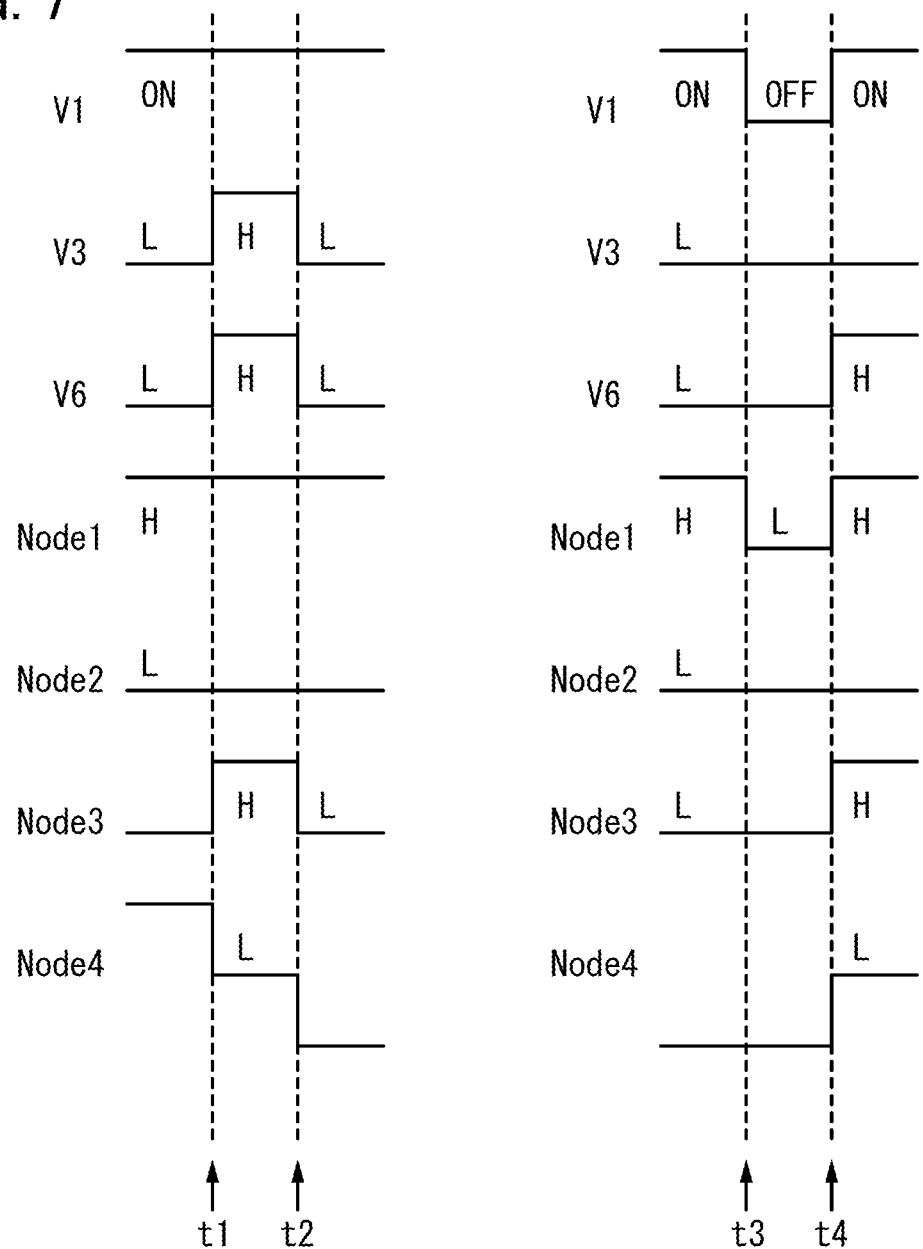

Next, a method for operating the semiconductor device of FIG. 6 ((1) writing operation, (2) stopping operation, and (3) resuming operation) is described. FIG. 7 is a timing chart in the operation of the semiconductor device of FIG. 6.

First, (1) writing operation is described.

At timing t1 in FIGS. 7, V3 and V6 are set to 'H', whereby Tr1 and Tr4 are turned on. As a result, a potential corresponding to the potential of Node 1 ('H' in this example) is input to Node 3. Further, a potential corresponding to the potential of Node 2 ('L' in this example) is input to Node 4.

Then, at timing t2 in FIG. 7, V3 is set to 'L', whereby Tr1 and Tr4 are turned off. At the same time as t2, V6 is set to 'L'. As a result, Node 3 is 'L', so that Tr2 is turned off. Further, Node 4 is lower than 'L', so that Tr5 is also turned off.

Note that the timing when V6 is set to 'L' does not need to be the same time as t2, and V6 may be set to 'L' after V3 is set to 'L' (after t2). The timing when V6 is set to 'L' is preferably later than the timing when V3 is set to 'L', in which case transfer of charge held in C1 and C2 can be suppressed in some cases.

Next, (2) stopping operation is described.

At timing t3 in FIG. 7, V1 is turned off. In other words, the application of power supply voltage to the first circuit portion 101 is stopped. As a result, in the first circuit portion 101, the potential of Node 1 is lowered. However, as in FIG. 1, Tr1 and Tr4 are off in FIG. 6; thus, charge transfer through Tr1 and Tr4 is suppressed as much as possible.

Next, (3) resuming operation is described.

At timing t4 in FIG. 7, V1 is turned on. In other words, power supply voltage is applied to the first circuit portion 101 again.

At the same time (as the t4), V6 is set to 'H', whereby Tr2 is turned on. Timing when V6 is set to 'H' does not need to be the same time as t4, and V6 may be set to 'H' before V1 is turned on (before t4). Tr2 is preferably turned on before V1 is turned on, in which case resuming operation can be performed at higher speed in some cases.

As a result of turning on Tr2, the second wiring 104 is electrically connected to Node 2 through Tr2. Then, a potential corresponding to V2 ('L' in this example) is input to Node 2. The potential of Node 1 is a potential inverted from that of Node 2; thus, an 'H'-level potential is input to Node 1. That is, potentials corresponding to the potentials held in Node 1 and Node 2 before the application of power supply voltage is stopped are input to Node 1 and Node 2.

In the above example, Node 1 is set to 'H' and Node 2 is set to 'L'; however, these potentials may be reversed to each other.

As described above, in this embodiment, V6 is variable and the capacitance values of C1 and C2 can be rewritten. By the rewriting operation to C1 and C2, conduction of Tr2 and Tr5 can be controlled, and timing of the resuming operation can be adjusted. Note that the rewriting operation is not necessarily performed.

Figure 14A:
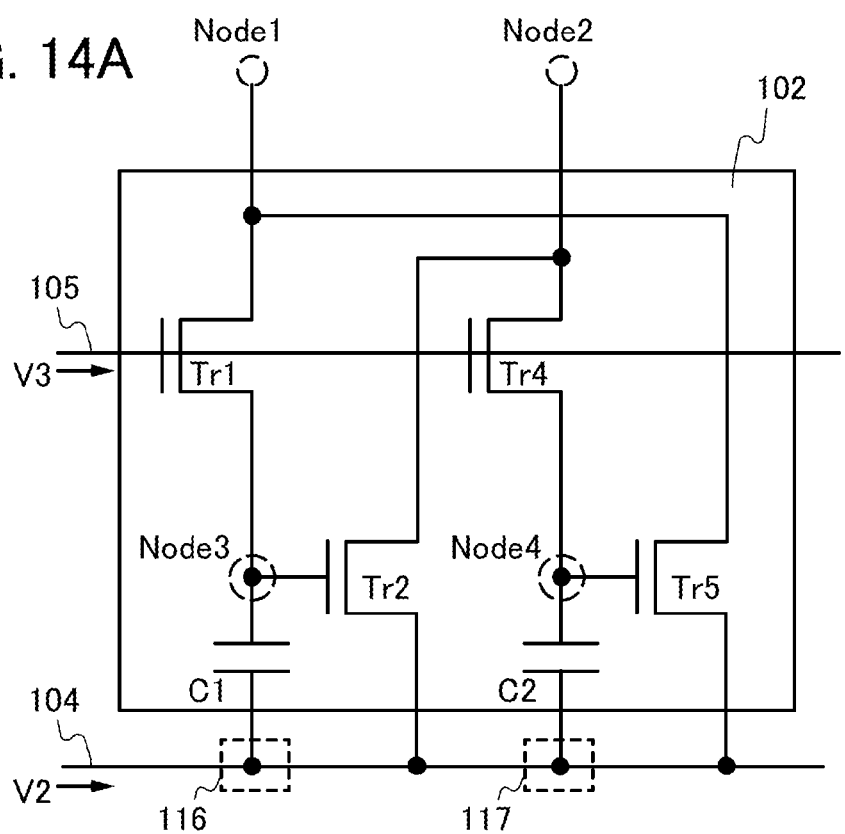

In FIG. 6, the configuration in which the second electrode of C1 and the second electrode of C2 are electrically connected to the sixth wiring 112; however, a configuration is not limited thereto, and the configuration described in any of the other embodiments may be used. For example, the second electrode of C1 and the second electrode of C2 may be electrically connected to the second wiring 104. FIG. 14A illustrates an example of a semiconductor device in which the second electrode of C1 and the second electrode of C2 are electrically connected to the second wiring 104. A circuit of FIG. 14A is different from the circuit of FIG. 6 in that connection relations indicated by a dashed line 116 and a dashed line 117 are included.

Further, FIG. 15 is a timing chart of the circuit of FIG. 14A.

In the semiconductor device of FIG. 14A, Node 1 and Node 3 are operated in conjunction with each other and Node 2 and Node 4 are operated in conjunction with each other. First, V3 is set to 'H', whereby Tr1 and Tr4 are turned on. Then, when 'L' is input to Node 1 at t1 in FIG. 15, 'L' is input to Node 3 in conjunction with the input of 'L' to Node 1. On the other hand, 'H' is input to Node 2, and 'H' is input to Node 4 in conjunction with the input of 'H' to Node 2. As a result, Tr5 is turned on and Tr2 is turned off. As described above, in the semiconductor device of FIG. 14A, data is written to the second circuit portion 102 by operation different from the writing operation in other examples. In other words, the writing operation in other examples is not needed.

Next, stopping operation is described. At t3 in FIG. 15, V1 is turned off. In other words, the application of power supply voltage to the first circuit portion 101 is stopped. As a result, in the first circuit portion 101, the potential of Node 2 is lowered. Here, it is effective to set V3 to 'L' before V1 is turned off so that Tr1 and Tr4 are turned off, because the potentials of Node 3 and Node 4 can be held after the power supply voltage is stopped.

Next, resuming operation is described. At t4 in FIG. 15, V1 is turned on. In other words, the power supply voltage is applied to the first circuit portion 101 again. The transistor Tr5 is on; thus, a potential corresponding to V2 ('L' in this example) is input to Node 1. Further, the potential of Node 2 is a potential inverted from that of Node 1; thus, an 'H'-level potential is input to Node 2. That is, potentials corresponding to the potentials held in Node 1 and Node 2 before the application of power supply voltage is stopped are input to Node 1 and Node 2. Here, it is effective to set V3 to 'H' after V1 is turned on so that Tr1 and Tr4 are turned on, because Node 1 and Node 3 can be operated in conjunction with each other and Node 2 and Node 4 can be operated in conjunction with each other again.

In FIG. 14A, Tr2 and Tr5 each have n-type conductivity; however, an n-channel transistor and a p-channel transistor can be combined in accordance with the circuit configuration.

Figure 14B:
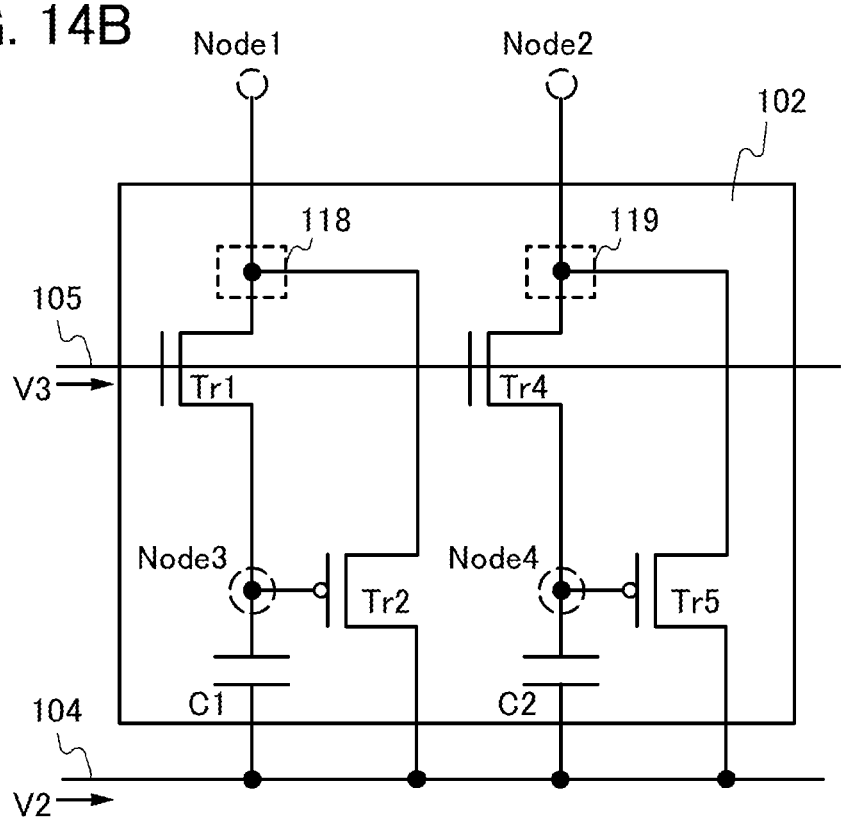

Further, FIG. 14B illustrates an example of a semiconductor device. A circuit of FIG. 14B is different from the circuit of FIG. 14A in that connection relations indicated by a dashed line 118 and a dashed line 119 are included. Specifically, the one of the source and the drain of Tr2 is electrically connected to Node 1 (the dashed line 118). Further, the one of the source and the drain of Tr5 is electrically connected to Node 2 (the dashed line 119). Other connection relations and the like are similar to those in FIG. 14A.

In the circuit of FIG. 14B, Tr2 and Tr5 each have p-type conductivity. Thus, when 'L' is written to Node 1, 'L' is written to the Node 3 in conjunction with the writing of 'L' to Node 1, so that Tr2 is turned on. On the other hand, when 'H' is written to Node 2, 'H' is written to Node 4 in conjunction with the writing of 'H' to Node 2, so that Tr5 is turned off. Then, through the stopping operation and the resuming operation, V2 ('L' in this example) is input to Node 1. Further, a potential inverted from that of Node 1 ('H' level) is input to Node 2. As a result, Node 1 is 'L' which corresponds to data before power supply stop and Node 2 is 'H' which also corresponds to data before power supply stop.

In FIG. 14B, Tr2 and Tr5 each have p-type conductivity; however, an n-channel transistor and a p-channel transistor can be combined in accordance with the circuit configuration.

Further, the semiconductor materials, the structures, the designs of the sizes, and the like of Tr1, Tr2, Tr4, and Tr5 are the same as those in other embodiments.

According to this embodiment, the semiconductor device including such a novel circuit configuration as illustrated in FIG. 14A or FIG. 14B can be provided. Further, the circuit of FIG. 14B is effective because, by including the connection relations indicated by the dashed line 118 and the dashed line 119, intersection portions of a wiring, an electrode, and the like can be reduced and the lengths of the wiring, the electrode, and the like can be shortened as compared to the circuit of FIG. 14A.

Also in the semiconductor device of this embodiment, data stored in the first circuit portion 101 is transmitted to the second circuit portion 102 (writing operation), the data is stored in the second circuit portion 102 in a period during which the application of power supply voltage is stopped (stopping operation), and data based on the data is transmitted to the first circuit portion 101 at the time of applying power supply voltage again (resuming operation). With such a configuration, a semiconductor device can store data even in a period during which the application of the power supply voltage is stopped.

Part or the whole of this embodiment can be freely combined with part or the whole of another embodiment.

(Embodiment 6)

Figure 8:
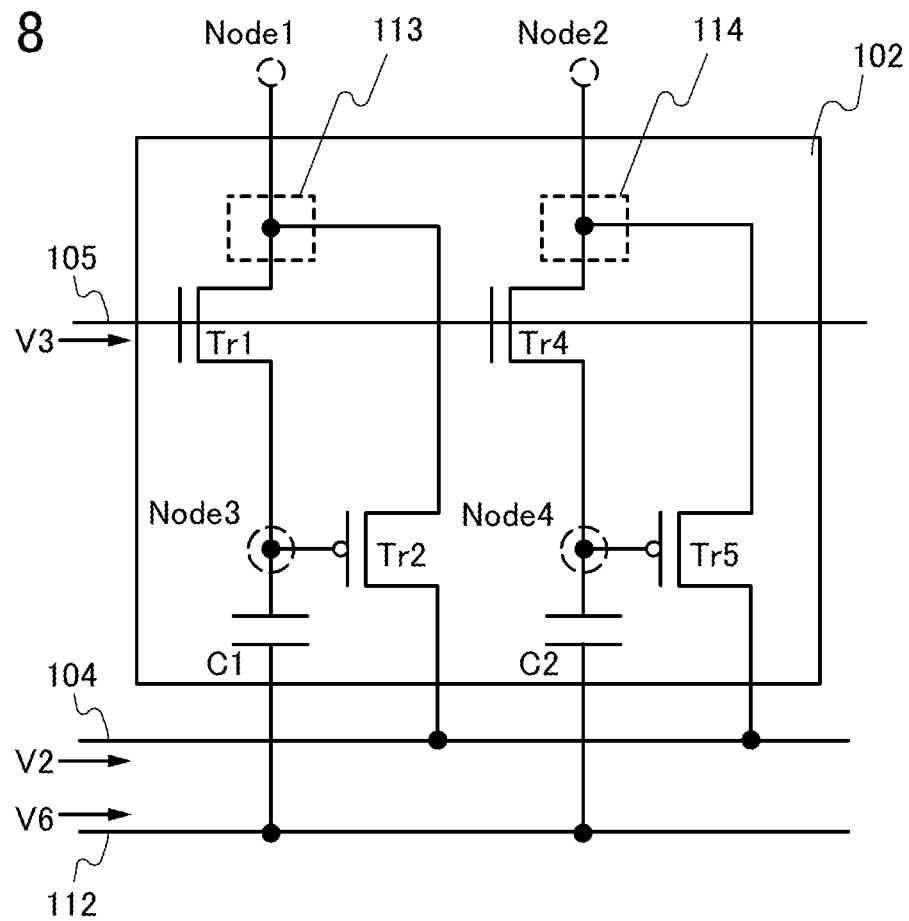

In this embodiment, an example of a semiconductor device is described. FIG. 8 illustrates an example of a semiconductor device.

A circuit of FIG. 8 is different from the circuit of FIG. 6 in that connection relations indicated by a dashed line 113 and a dashed line 114 are included. Specifically, the one of the source and the drain of Tr2 is electrically connected to Node 1 (the dashed line 113). Further, the one of the source and the drain of Tr5 is electrically connected to Node 2 (the dashed line 114). Other connection relations and the like are similar to those in FIG. 6.

According to this embodiment, the semiconductor device including such a novel circuit configuration as illustrated in FIG. 8 can be provided. Further, the circuit of FIG. 8 is effective because, by including the connection relations indicated by the dashed line 113 and the dashed line 114, intersection portions of a wiring, an electrode, and the like can be reduced and the lengths of the wiring, the electrode, and the like can be shortened as compared to the circuit of FIG. 6.

In the circuit of FIGS. 8, Tr2 and Tr5 each have p-type conductivity. Thus, when 'L' is written to Node 1, 'L' is written to Node 3 by the writing operation. Note that in FIG. 8, V6 is set to 'L' at t1 and is changed to 'H' at t2, whereby rewriting operation is performed in C1 and C2. Then, through the stopping operation and the resuming operation, V2 (e.g., Vss='L' level) is input to Node 1. Further, a potential inverted from that of Node 1 ('H' level) is input to Node 2. As a result, Node 1 is 'L' which corresponds to data before power supply stop and Node 2 is 'H' which also corresponds to data before power supply stop.

In FIGS. 8, Tr2 and Tr5 each have p-type conductivity; however, an n-channel transistor and a p-channel transistor can be combined in accordance with the circuit configuration.

Further, the semiconductor materials, the structures, the designs of the sizes, and the like of Tr1, Tr2, Tr4, and Tr5 are the same as those in other embodiments.

As described above, in the semiconductor device of this embodiment, data stored in the first circuit portion 101 is transmitted to the second circuit portion 102 (writing operation), the data is stored in the second circuit portion 102 in a period during which the application of power supply voltage is stopped (stopping operation), and data based on the data is transmitted to the first circuit portion 101 at the time of applying power supply voltage again (resuming operation). With such a configuration, a semiconductor device can store data even in a period during which the application of the power supply voltage is stopped.

Part or the whole of this embodiment can be freely combined with part or the whole of another embodiment.

(Embodiment 7)

In this embodiment, an example of a semiconductor device is described. FIGS. 11A and 11B, FIG. 12, and FIG. 13 illustrate examples of a semiconductor device.

Figure 11A:
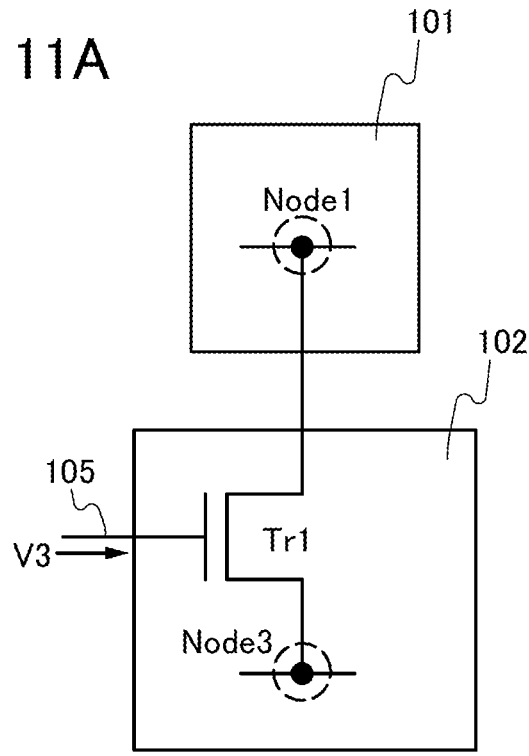

The semiconductor device of FIG. 11A includes the first circuit portion 101 and the second circuit portion 102.

The first circuit portion 101 includes Node 1. A variety of circuits can be applied to the first circuit portion 101. For example, a storage circuit, an arithmetic circuit, a selection circuit, or the like can be applied.

The second circuit portion 102 includes Node 3 and Tr1.

Node 1 is electrically connected to the one of the source and the drain of Tr1. The other of the source and the drain of Tr1 is electrically connected to Node 3. That is, Node 1 is electrically connected to Node 3 through Tr1. Note that as described in other embodiments, a capacitor may be electrically connected to Node 3.

Operation of the semiconductor device of FIG. 11A is described. First, Tr1 is turned on by V3 and data of Node 1 is transmitted to Node 3, and then Tr1 is turned off by V3 and the data is stored in Node 3 (writing operation). Next, the application of power supply voltage of the first circuit portion 101 is stopped (stopping operation). Then, the application of the power supply voltage of the first circuit portion 101 is resumed and Tr1 is turned on by V3, whereby the data of Node 3 is transmitted to Node 1 (resuming operation). In the above manner, the semiconductor device of FIG. 11A can store data.

Figure 11B:
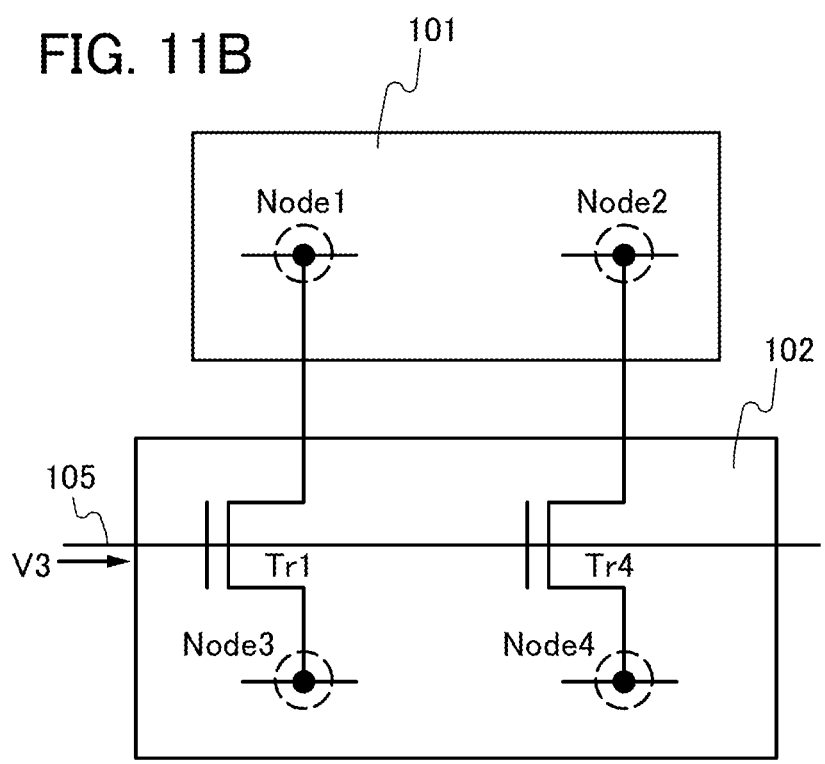

A semiconductor device of FIG. 11B is an example in which the first circuit portion 101 and the second circuit portion 102 each include a plurality of nodes. In this case, in a manner similar to that of FIG. 11A, when the application of the power supply voltage is stopped, the potential of Node 1 can be held in Node 3 and the potential of Node 2 can be held in Node 4. The potential of Node 2 may be the same as or different from the potential of Node 1.

FIG. 11B shows the case where the first circuit portion 101 and the second circuit portion 102 each have two nodes; however, three or more nodes may be included in each of these circuit portions and the potential of each node may be held in the second circuit portion 102. Note that as described in other embodiments, a capacitor may be electrically connected to Node 3 or Node 4.

Figure 12:
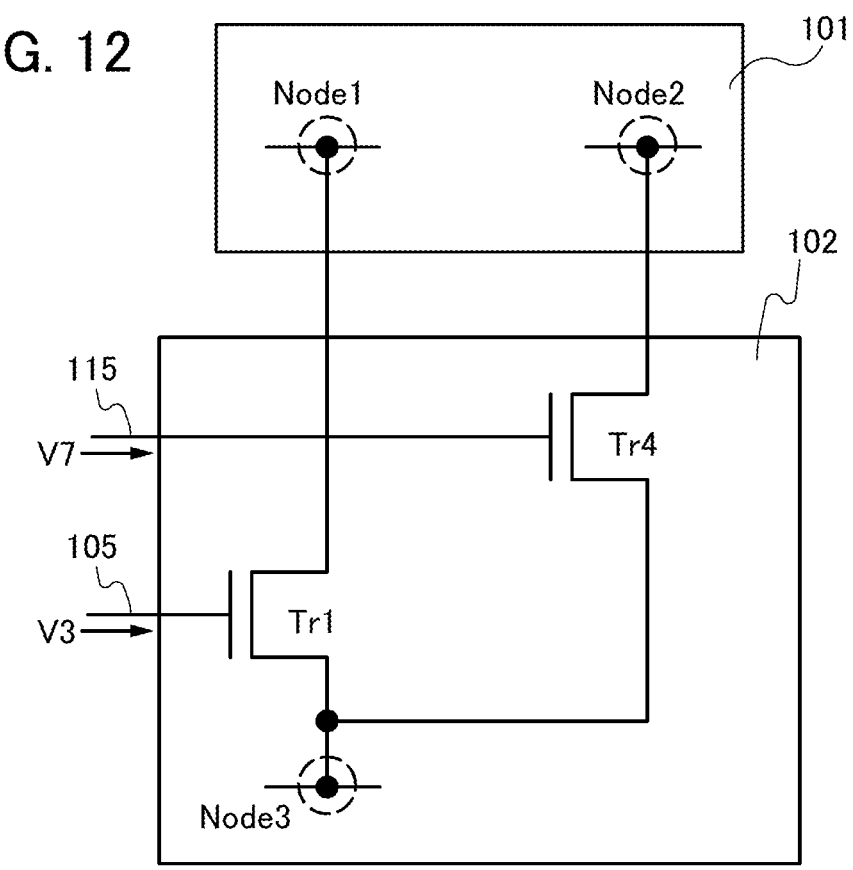

In a semiconductor device of FIG. 12, the first circuit portion 101 includes Node 1 and Node 2 and the second circuit portion 102 includes Node 3. The potential of Node 1 is held in Node 3, and after power supply resumption, the potential of Node 3 can be input to Node 1 or Node 2. Further, the potential of Node 3 can be input to both Node 1 and Node 2 after power supply resumption.

In FIG. 12, Node 1 is electrically connected to Node 3 through Tr1. Further, Node 2 is electrically connected to Node 3 through Tr4. The gate of Tr1 is electrically connected to the third wiring 105. The gate of Tr4 is electrically connected to the wiring 115. The third wiring 105 has a function of supplying V3 and controlling on/off of Tr1. Further, the wiring 115 has a function of supplying V7 and controlling on/off of Tr4. Note that as described in other embodiments, a capacitor may be electrically connected to Node 3.

Figure 13:
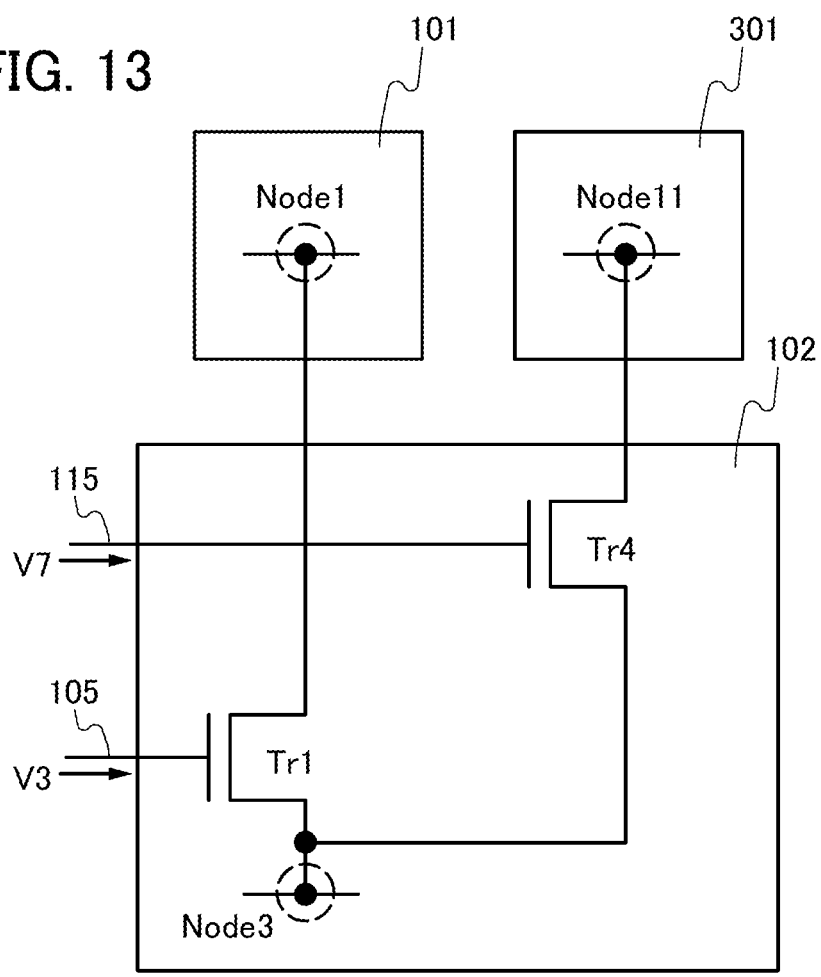

A semiconductor device of FIG. 13 is an example in which a plurality of first circuit portions is included. The semiconductor device of FIG. 13 includes the first circuit portion 101 and the first circuit portion 301. The first circuit portion 101 includes Node 1 and the first circuit portion 301 includes Node 11. The potential of Node 1 or Node 11 is held in Node 3, and after power supply resumption, the potential of Node 3 can be input to Node 1 or Node 11. Further, the potential of Node 3 can be input to both Node 1 and Node 11 after power supply resumption. A variety of circuits can be applied to the first circuit portion 301. For example, a storage circuit, an arithmetic circuit, a selection circuit, or the like can be applied.

In FIG. 13, Node 1 is electrically connected to Node 3 through Tr1. Further, Node 11 is electrically connected to Node 3 through Tr4. The gate of Tr1 is electrically connected to the third wiring 105. The gate of Tr4 is electrically connected to the wiring 115. The third wiring 105 has a function of supplying V3 and controlling on/off of Tr1. Further, the wiring 115 has a function of supplying V7 and controlling on/off of Tr4. Note that as described in other embodiments, a capacitor may be electrically connected to Node 3.

Further, the conductivities, the semiconductor materials, the structures, the designs of the sizes, and the like of Tr1 and Tr4 are the same as those in other embodiments.

As described above, in the semiconductor device of this embodiment, data stored in the first circuit portion 101 or the first circuit portion 301 is transmitted to the second circuit portion 102 (writing operation), the data is stored in the second circuit portion 102 in a period during which the application of power supply voltage is stopped (stopping operation), and data based on the data is transmitted to the first circuit portion 101 or the first circuit portion 301 at the time of applying power supply voltage again (resuming operation). With such a configuration, a semiconductor device can store data even in a period during which the application of the power supply voltage is stopped.

Part or the whole of this embodiment can be freely combined with part or the whole of another embodiment.

(Embodiment 8)

In this embodiment, an example of a semiconductor device is described. In this embodiment, an example of an oxide semiconductor that can be used for a channel of a transistor is shown.

The oxide semiconductor preferably contains at least indium (In) or zinc (Zn). In addition, as a stabilizer for reducing the variation in electrical characteristics of a transistor using the oxide semiconductor, it is preferable that gallium (Ga) be additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a gallium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide means an oxide containing In, Ga, and Zn, and there is no limitation on the ratio of In:Ga:Zn. In addition, the oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with the In—Sn—Zn-based oxide, a high mobility can be relatively easily obtained. However, mobility can be increased by reducing the defect density in the bulk also in the case of using the In—Ga—Zn-based oxide.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a c-axis aligned crystalline oxide semiconductor (CAAC-OS).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, the c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

When the CAAC-OS film is analyzed by an out-of-plane method with an X-ray diffraction (XRD) apparatus, a peak appears at 2θ of around 31° in some cases. In the case of a crystal of $InGaZnO_4$, the peak at 2θ of around 31° indicates that the crystal of $InGaZnO_4$ has (009) plane alignment. Further, in the CAAC-OS film, a peak appears at 2θ of around 36° in some cases. In the case of a crystal of $ZnGa_2O_4$, the peak at 2θ of around 36° indicates that the crystal of $ZnGa_2O_4$ has (222) plane alignment. In the CAAC-OS film, it is preferable that the peak appear at 2θ of around 31° and do not appear at 2θ of around 36°.

For example, when the CAAC-OS film including a crystal of $InGaZnO_4$ is analyzed with an XRD apparatus by an in-plane method in which an X-ray enters a sample in a direction perpendicular to the c-axis, a peak appears at 2θ of around 56° in some cases. The peak at 2θ of around 56° is derived from the (110) plane of the $InGaZnO_4$ crystal. Here, when analysis (φ scan) is performed with 2θ fixed at around 56° and with a sample rotated using a normal vector of a surface of the sample as an axis (φ axis), although six peaks having symmetry appear in the case of a single crystal oxide semiconductor in which the directions of an a-axis and a b-axis of one crystal part are the same as those of another crystal part, a peak is not clearly observed in the case of the CAAC-OS film.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

For example, the CAAC-OS film is formed by a sputtering method with a polycrystalline metal oxide target.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

The oxide semiconductor layer is not limited to a single metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose energy at the bottom of the conduction band is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. Further, the second metal oxide film preferably contains at least indium in order to increase the carrier mobility.

In the transistor including the above semiconductor film, when a voltage is applied to the gate electrode so that an electric field is applied to the semiconductor film, a channel region is formed in the second metal oxide film, whose energy at the bottom of the conduction band is the lowest. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, it is preferable that a plurality of metal oxide films be stacked so that an interface level due to impurities existing between the metal oxide films, which inhibits carrier flow, is not formed at the interface between the metal oxide films. This is because if impurities exist between the stacked metal oxide films, the continuity of the energy at the bottom of the conduction band between the metal oxide films is lost, and carriers are trapped or disappear by recombination in the vicinity of the interface. By reducing impurities existing between the films, a continuous junction (here, particularly a U-shape well structure with the energy at the bottom of the conduction band changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering apparatus) provided with a load lock chamber. Each chamber of the sputtering apparatus is preferably evacuated to a high vacuum (approximately $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of $-40°$ C. or lower, preferably $-80°$ C. or lower, more preferably $-100°$ C. or lower is used, so that entry of moisture or the like into the oxide semiconductor film can be prevented as much as possible.

For example, the first metal oxide film and/or the third metal oxide film can be an oxide film that contains aluminum, silicon, titanium, gallium, germanium, yttrium, zirconium, tin, lanthanum, cerium, or hafnium at a higher atomic ratio than the second metal oxide film. Specifically, the first metal oxide film and/or the third metal oxide film is preferably an oxide film with a content of any of the above elements 1.5 or more times, preferably 2 or more times, further preferably 3 or more times that of the second metal oxide film in an atomic ratio. The above element is strongly bonded to oxygen and thus has a function of suppressing generation of oxygen vacancies in the oxide film. Accordingly, the first metal oxide film and/or the third metal oxide film can be an oxide film in which oxygen vacancies are less likely to be generated than in the second metal oxide film.

The thickness of the first metal oxide film and the third metal oxide film is greater than or equal to 3 nm and less than or equal to 100 nm, preferably greater than or equal to 3 nm and less than or equal to 50 nm. The thickness of the second metal oxide film is greater than or equal to 3 nm and less than or equal to 200 nm, preferably greater than or equal to 3 nm and less than or equal to 100 nm, further preferably greater than or equal to 3 nm and less than or equal to 50 nm.

In the three-layer semiconductor film, the first to third metal oxide films can be amorphous or crystalline. Note that the transistor can have stable electrical characteristics when the second metal oxide film where a channel region is formed is crystalline; therefore, the second metal oxide film is preferably crystalline.

The oxide semiconductor described in this embodiment is used for the semiconductor devices described in other embodiments, whereby a novel semiconductor device can be provided. Further, reliability or characteristics of the semiconductor device can be improved. In particular, the oxide semiconductor is used for Tr1 to Tr6 in other embodiments, whereby the off-state current of the transistors can be extremely low. In particular, the oxide semiconductor is used for Tr1 and Tr4, whereby the potential can be extremely favorably held in Node 3 or Node 4.

Part or the whole of this embodiment can be freely combined with part or the whole of another embodiment.

(Embodiment 9)

In this embodiment, an example of a semiconductor device is described. In this embodiment, an example of a semiconductor device including a Si-Tr and an OS-Tr is shown. In particular, an example in which the Si-Tr and the OS-Tr are stacked is described.

Figure 9:
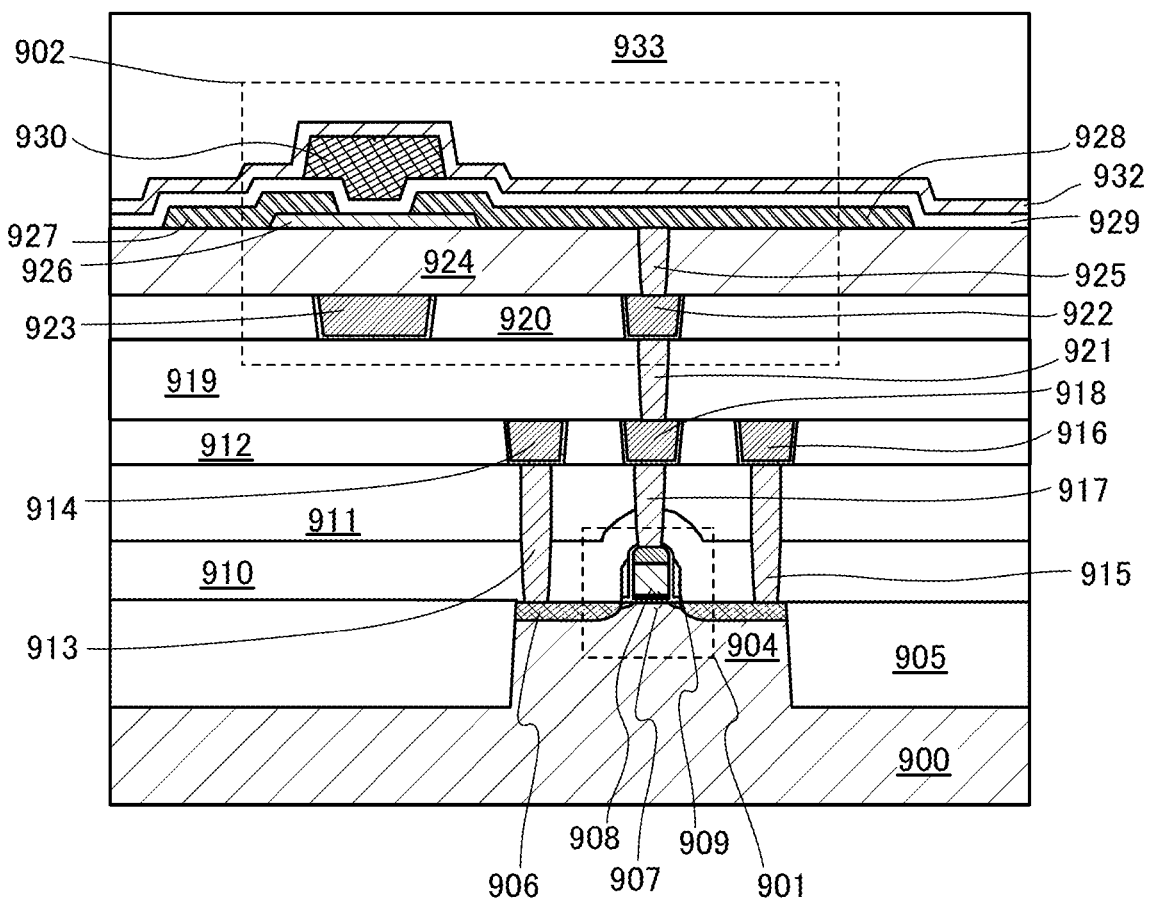

In this embodiment, referring to FIG. 9, description is given of examples of a structure and a manufacturing method of a semiconductor device including a transistor 902 whose channel is formed in an oxide semiconductor layer and a transistor 901 whose channel is formed in a single crystal silicon wafer. Note that the transistor 902 can be used as any of the transistors illustrated in other embodiments.

Note that a semiconductor material such as germanium, silicon germanium, or single crystal silicon carbide as well as silicon may be used for the transistor 901. A transistor including silicon can be formed using a silicon thin film formed by an SOI method or a silicon thin film formed by vapor deposition, for example; in this case, a glass substrate formed by a fusion process or a float process, a quartz substrate, a semiconductor substrate, a ceramic substrate, or the like can be used as a substrate. In the case where a glass substrate is used and the temperature of heat treatment to be performed later is high, it is preferable to use a glass substrate with a strain point of 730° C. or higher.

In the semiconductor device illustrated in FIG. 9, the transistor 901 using a single crystal silicon wafer is formed, and the transistor 902 using an oxide semiconductor is formed above the transistor 901. In other words, the semiconductor device described in this embodiment is a semiconductor device that has a three-dimensional layered structure in which a silicon wafer is used as a substrate and a transistor layer is provided above the silicon wafer. Moreover, the semiconductor device in this example is a hybrid semiconductor device including a transistor in which silicon is used for a channel formation region and a transistor in which an oxide semiconductor is used for a channel formation region.

The transistor 901 formed using a substrate 900 containing a semiconductor material can be either an n-channel transistor (nMOSFET) or a p-channel transistor (pMOSFET). In the example illustrated in FIG. 9, the transistor 901 is electrically isolated from other elements by a shallow trench isolation (STI) 905. The use of the STI 905 can reduce generation of a bird's beak, which may be caused by a LOCOS element isolation method, in an element isolation region and can reduce the size of the element isolation region. On the other hand, in a semiconductor device that is not required to be structurally miniaturized or downsized, the STI 905 is not necessarily formed and an element isolation means such as LOCOS can be used. In the substrate 900 where the transistor 901 is formed, a well 904 to which an impurity imparting conductivity, such as boron, phosphorus, or arsenic, is added is formed.

The transistor 901 in FIG. 9 includes a channel formation region in the substrate 900, impurity regions 906 (also referred to as a source region and a drain region) provided such that the channel formation region is placed therebetween, a gate insulating film 907 over the channel formation region, and a gate electrode layer 908 provided over the gate insulating film 907 to overlap with the channel formation region. The gate electrode layer 908 can have a stacked structure of a gate electrode layer including a first material for increasing processing accuracy and a gate electrode layer including a second material for decreasing the resistance as a wiring. For example, the gate electrode layer can have a stacked structure of crystalline silicon to which an impurity imparting conductivity, such as phosphorus, is added and nickel silicide. Note that the structure is not limited to this, and materials, the number of stacked layers, the shape, or the like can be adjusted as appropriate depending on required specifications.

Note that the transistor 901 illustrated in FIG. 9 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film placed between the gate electrode layer and the protrusion. With the second transistor having a fin-type structure, the channel width can be reduced to achieve higher integration of transistors. Moreover, a larger amount of current can flow through the transistor and the control efficiency can be increased, so that the off-state current and threshold voltage of the transistor can be reduced.

Contact plugs 913 and 915 are connected to the impurity regions 906 in the substrate 900. Here, the contact plugs 913 and 915 also function as a source electrode and a drain electrode of the transistor 901. In addition, impurity regions that are different from the impurity regions 906 are provided between the impurity regions 906 and the channel formation region. The impurity regions function as LDD regions or extension regions for controlling the distribution of electric fields in the vicinity of the channel formation region, depending on the concentration of an impurity introduced thereto. Sidewall insulating films 909 are provided at side surfaces of the gate electrode layer 908 with an insulating film placed therebetween. By using this insulating film and the sidewall insulating films 909, the LDD regions or extension regions can be formed.

The transistor 901 is covered with an insulating film 910. The insulating film 910 can function as a protective film and can prevent impurities from entering the channel formation region from the outside. With the insulating film 910 formed by CVD using a material such as silicon nitride, hydrogenation can be performed by heat treatment in the case where single crystal silicon is used for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and a surface of the insulating film 911 is planarized by CMP. Consequently, element layers can be stacked with high accuracy above a layer including the transistor 901.

A layer including the transistor 902 in which an oxide semiconductor film is used for a channel is formed above the layer including the transistor 901. The transistor 902 is a top-gate transistor. The transistor 902 includes a source electrode layer 927 and a drain electrode layer 928 in contact with side surfaces and an upper surface of an oxide semiconductor film 926, and includes a gate electrode layer 930 over a gate insulating film 929 placed over the oxide semiconductor film 926, the source electrode layer 927, and the drain electrode layer 928. Insulating films 932 and 933 are formed to cover the transistor 902. Here, a method of fabricating the transistor 902 will be described below.

The oxide semiconductor film 926 is formed over the insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. In particular, the insulating film 924 is preferably formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than a dense insulating film, parasitic capacitance due to electrodes or wirings can be further reduced. In this embodiment, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is 2 nm to 200 nm, preferably 3 nm to 50 nm, more preferably 3 nm to 20 nm. The oxide semiconductor film is formed by sputtering using an oxide semiconductor target. Moreover, the oxide semiconductor film can be formed by sputtering under a rare gas (e.g., argon) atmosphere, an oxygen atmosphere, or a mixed atmosphere of a rare gas (e.g., argon) and oxygen.

Note that before the oxide semiconductor film is formed by sputtering, dust on a surface of the insulating film 924 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In this embodiment, an In—Ga—Zn-based oxide semiconductor thin film that has a thickness of 30 nm and is obtained by sputtering using a target including indium (In), gallium (Ga), and zinc (Zn) is used as the oxide semiconductor film. As the target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is higher than or equal to 90% and lower than or equal to 100%, preferably higher than or equal to 95% and lower than 100%. With the use of the target with high filling rate, a dense oxide semiconductor film is formed.

In the case where an In—Zn-based material is used for the oxide semiconductor film, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an In—Zn-based oxide semiconductor with an atomic ratio of In:Zn:O=X:Y:Z, the relation of Z>1.5X+Y is satisfied. The mobility can be improved by keeping the ratio of Zn within the above range.

In the case where an In—Sn—Zn-based oxide semiconductor film is formed as the oxide semiconductor film by sputtering, it is preferable to use an In—Sn—Zn—O target having an atomic ratio of In:Sn:Zn=1:1:1, 2:1:3, 1:2:2, or 20:45:35.

In this embodiment, the oxide semiconductor film is formed in such a manner that the substrate is held in a process chamber kept in a reduced pressure state, a sputtering gas from which hydrogen and moisture are removed is introduced while moisture remaining in the process chamber is removed, and the above-described target is used. The substrate temperature during the deposition may be 100° C. to 600° C., preferably 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the process chamber, an entrapment vacuum pump is preferably used. For example, a cryopump, an ion pump, or a titanium sublimation pump is preferably used. The evacuation unit may be a turbo pump provided with a cold trap. In the process chamber which is evacuated with the cryopump, for example, a hydrogen atom, a compound containing a hydrogen atom, such as water ($H_2O$), and the like are removed, whereby the impurity concentration in the oxide semiconductor film formed in the process chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferably used because dust generated in deposition can be reduced and the film thickness can be made uniform.

By setting the leakage rate of the process chamber of the sputtering apparatus to $1 \times 10^{-10}$ Pa·m$^3$/s or less, impurities, such as an alkali metal or a hydride, which enter the oxide semiconductor film that is being formed by sputtering can be reduced. Further, with the use of an entrapment vacuum pump as an exhaustion system, counter flow of impurities such as an alkali metal, a hydrogen atom, a hydrogen molecule, water, or a hydride from the exhaustion system can be reduced.

When the purity of the target is set to 99.99% or higher, an alkali metal, a hydrogen atom, a hydrogen molecule, water, a hydroxyl group, a hydride, or the like entering the oxide semiconductor film can be reduced. In addition, when the above target is used, the concentration of an alkali metal such as lithium, sodium, or potassium can be reduced in the oxide semiconductor film.

In order that the oxide semiconductor film contains hydrogen, a hydroxyl group, and moisture as little as possible, it is preferable that impurities such as moisture or hydrogen that are adsorbed on the substrate 900 be desorbed and exhausted by preheating of the substrate 900 over which the insulating film 924 is formed in a preheating chamber of a sputtering apparatus, as pretreatment for deposition. The temperature for the preheating is 100° C. to 400° C., preferably 150° C. to 300° C. As an evacuation unit provided in the preheating chamber, a cryopump is preferably used. Note that this preheating treatment is not necessarily performed.

Note that etching for forming the oxide semiconductor film 926 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

As the dry etching method, a parallel plate reactive ion etching (RIE) method or an inductively coupled plasma (ICP) etching method can be used. In order to etch the film into a desired shape, the etching conditions (e.g., the electric power applied to a coiled electrode, the electric power applied to an electrode on the substrate side, and the electrode temperature on the substrate side) are adjusted as appropriate.

A resist mask used for forming the oxide semiconductor film 926 may be formed by an inkjet method. Formation of the resist mask by an inkjet method needs no photomask; thus, fabrication cost can be reduced.

Note that it is preferable that reverse sputtering be performed before the formation of a conductive film in a subsequent step so that a resist residue and the like that attach onto surfaces of the oxide semiconductor film 926 and the insulating film 924 are removed.

Note that the oxide semiconductor film formed by sputtering or the like sometimes contains a large amount of moisture or hydrogen (including a hydroxyl group) as impurities. Moisture or hydrogen easily forms donor levels and thus serves as impurities in the oxide semiconductor. Therefore, in this embodiment of the present invention, in order to reduce impurities such as moisture and hydrogen in the oxide semiconductor film (dehydrate or dehydrogenate the oxide semiconductor film), the oxide semiconductor film 926 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, more preferably 10 ppb or less, in the case where the measurement is performed by a dew point meter of a cavity ring down laser spectroscopy (CRDS) system).

By performing heat treatment on the oxide semiconductor film 926, moisture or hydrogen in the oxide semiconductor film 926 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may have a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon, is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Through the above-described steps, the concentration of hydrogen in the oxide semiconductor film 926 can be reduced and the oxide semiconductor film 926 can be highly purified. Thus, the oxide semiconductor film can be stable. In addition, by using the oxide semiconductor film in which the hydrogen concentration is reduced and the purity is improved, it is possible to fabricate a transistor with high withstand voltage and extremely small off-state current. The above heat treatment can be performed at any time after the oxide semiconductor film is formed.

Next, the source electrode layer 927 and the drain electrode layer 928 are formed by a photolithography process. Specifically, the source electrode layer 927 and the drain electrode layer 928 can be formed in such a manner that a conductive film is formed over the insulating film 924 by sputtering or vacuum evaporation and then processed (patterned) into a predetermined shape.

In this embodiment, a 100-nm-thick tungsten film is used for the source electrode layer 927 and the drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partially etched and thus a groove (a depressed portion) is formed in some cases.

In this embodiment, a tungsten film is used as the conductive film to be the source electrode layer 927 and the drain electrode layer 928. Thus, wet etching can be selectively performed on the conductive film using a solution containing ammonia and hydrogen peroxide water (an ammonia hydrogen peroxide mixture). As the ammonia hydrogen peroxide mixture, a solution in which 31 wt % hydrogen peroxide water, 28 wt % ammonia water, and water are mixed at a volume ratio of 5:2:2 is specifically used. Alternatively, dry etching may be performed on the conductive film with the use of a gas containing carbon tetrafluoride (CE), chlorine ($Cl_2$), or oxygen.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by ashing; thus, the resist mask can be used in a plurality of etching steps for processing films into different patterns. That is, a resist mask corresponding to at least two kinds of different patterns can be formed by one multi-tone mask. As a result, the number of light-exposure masks can be reduced and the number of corresponding photolithography processes can also be reduced, whereby the fabrication process can be simplified.

Further, an oxide conductive film functioning as a source region and a drain region may be provided between the oxide semiconductor film 926 and the source and drain electrode layers 927 and 928. The material of the oxide conductive film preferably contains zinc oxide as a component and preferably does not contain indium oxide. For such an oxide conductive film, zinc oxide, zinc aluminum oxide, zinc aluminum oxynitride, zinc gallium oxide, or the like can be used.

For example, in the case where the oxide conductive film is formed, patterning for forming the oxide conductive film and patterning for forming the source electrode layer 927 and the drain electrode layer 928 may be performed concurrently.

By providing the oxide conductive film functioning as the source and drain regions, the resistance between the oxide semiconductor film 926 and the source and drain electrode layers 927 and 928 can be lowered, so that the transistor can operate at high speed. In addition, by providing the oxide conductive film functioning as the source and drain regions, the withstand voltage of the transistor can be increased.

Next, plasma treatment may be performed using a gas such as $N_2O$, $N_2$, or Ar. By this plasma treatment, water or the like attached onto an exposed surface of the oxide semiconductor film is removed. Plasma treatment may be performed using a mixture gas of oxygen and argon.

After the plasma treatment, the gate insulating film 929 is formed to cover the source and drain electrode layers 927 and 928 and the oxide semiconductor film 926. Then, over the gate insulating film 929, the gate electrode layer 930 is formed to overlap with the oxide semiconductor film 926.

In this embodiment, a 20-nm-thick silicon oxynitride film formed by sputtering is used as the gate insulating film 929. The substrate temperature during the film formation may range from room temperature to 400° C. and is 300° C. in this embodiment.

After the gate insulating film 929 is formed, heat treatment may be performed. The heat treatment is performed in a nitrogen atmosphere, ultra-dry air, or a rare gas (e.g., argon or helium) atmosphere preferably at 200° C. to 400° C., and for example at 250° C. to 350° C. It is preferable that the water content in the gas be 20 ppm or less, preferably 1 ppm or less, more preferably 10 ppb or less. In this embodiment, for example, heat treatment is performed in a nitrogen atmosphere at 250° C. for 1 hour. Alternatively, RTA treatment for a short time at a high temperature may be performed before the formation of the source and drain electrode layers 927 and 928 in a manner similar to that of the heat treatment performed on the oxide semiconductor film for reduction of moisture or hydrogen. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be satisfied. As a result, the oxide semiconductor film 926 can be made to be substantially i-type and variations in electrical characteristics of the transistor due to oxygen vacancies can be reduced; thus, electrical characteristics can be improved. There is no particular limitation on the timing of this heat treatment as long as it is after the formation of the gate insulating film 929. When this heat treatment doubles as another step, the oxide semiconductor film 926 can be made to be substantially i-type without increase in the number of steps.

Moreover, oxygen vacancies that serve as donors in the oxide semiconductor film 926 may be reduced by subjecting the oxide semiconductor film 926 to heat treatment in an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (i.e., the impurity concentration in the oxygen gas is preferably 1 ppm or lower, more preferably 0.1 ppm or lower).

Alternatively, oxygen may be added to the oxide semiconductor film 926 by ion implantation, ion doping, or the like to reduce oxygen vacancies serving as donors. For example, oxygen that is made into a plasma state with a microwave at 2.45 GHz may be added to the oxide semiconductor film 926.

The gate electrode layer 930 can be formed in such a manner that a conductive film is formed over the gate insulating film 929 and then is patterned.

The thickness of the gate electrode layer 930 is 10 nm to 400 nm, preferably 100 nm to 300 nm. In this embodiment, the gate electrode layer 930 is formed in the following manner: a 135-nm-thick tungsten film is stacked over a 30-nm-thick tantalum nitride film by sputtering to form a conductive film for the gate electrode, and then, the conductive film is processed (patterned) into a desired shape by etching. Note that a resist mask may be formed by an inkjet method. Formation of the resist mask by an inkjet method needs no photomask; thus, fabrication cost can be reduced.

Through the above steps, the transistor 902 is formed.

Note that the transistor 902 is described as a single-gate transistor; if necessary, it is possible to fabricate a multi-gate transistor that includes a plurality of gate electrodes electrically connected to each other and thus includes a plurality of channel formation regions.

In the fabrication method described above, the source electrode layer 927 and the drain electrode layer 928 are formed after the oxide semiconductor film 926. Accordingly, as illustrated in FIG. 9, in the transistor 902 obtained by the above-described method, the source electrode layer 927 and the drain electrode layer 928 are formed over the oxide semiconductor film 926. Alternatively, in the transistor 902, the source and drain electrode layers may be formed below the oxide semiconductor film 926, that is, between the oxide semiconductor film 926 and the insulating film 924.

Note that an insulating film in contact with the oxide semiconductor film 926 may be formed using an insulating material containing an element that belongs to Group 13 and oxygen. Many of oxide semiconductor materials contain a Group 13 element, and an insulating material containing a Group 13 element is compatible with an oxide semiconductor. Thus, when an insulating material containing a Group 13 element is used for the insulating film in contact with the oxide semiconductor film, the state of the interface between the oxide semiconductor film and the insulating film can be kept favorable.

An insulating material containing a Group 13 element is an insulating material containing one or more elements that belong to Group 13. As the insulating material containing a Group 13 element, gallium oxide, aluminum oxide, aluminum gallium oxide, gallium aluminum oxide, and the like are given. Here, the amount of aluminum is larger than that of gallium in atomic percent in aluminum gallium oxide, whereas the amount of gallium is larger than or equal to that of aluminum in atomic percent in gallium aluminum oxide.

For example, in the case of forming an insulating film in contact with an oxide semiconductor film containing gallium, a material containing gallium oxide may be used for the insulating film, so that favorable characteristics can be kept at the interface between the oxide semiconductor film and the insulating film. For example, the oxide semiconductor film and an insulating film containing gallium oxide are provided in contact with each other, so that pileup of hydrogen at the interface between the oxide semiconductor film and the insulating film can be reduced. Note that a similar effect can be obtained in the case where an element in the same group as a constituent element of the oxide semiconductor is used in the insulating film. For example, it is effective to form an insulating film with the use of a material containing aluminum oxide. Note that water is less likely to permeate aluminum oxide, and it is therefore preferable to use a material containing aluminum oxide in terms of preventing entry of water to the oxide semiconductor film.

The insulating film which is in contact with the oxide semiconductor film 926 preferably contains oxygen in a proportion higher than the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

By oxygen doping, an insulating film that includes a region where the proportion of oxygen is higher than that in the stoichiometric composition can be formed. When the insulating film including such a region is in contact with the oxide semiconductor film, excess oxygen in the insulating film is supplied to the oxide semiconductor film, and oxygen vacancies in the oxide semiconductor film or at the interface between the oxide semiconductor film and the insulating film are reduced. Thus, the oxide semiconductor film can be made to be i-type or substantially i-type.

Note that the insulating film including a region where the proportion of oxygen is higher than that in the stoichiometric composition may be used as either the insulating film placed above the oxide semiconductor film 926 or the insulating film placed below the oxide semiconductor film 926 of the insulating films in contact with the oxide semiconductor film 926; however, it is preferable to use such an insulating film as both of the insulating films in contact with the oxide semiconductor film 926. The above-described effect can be enhanced with a structure in which the insulating films each including a region where the proportion of oxygen is higher than that in the stoichiometric composition are used as the insulating films in contact with the oxide semiconductor film 926 and positioned above and below the oxide semiconductor film 926 so that the oxide semiconductor film 926 is sandwiched between the insulating films.

The constituent elements may be the same or different between the insulating films placed above and below the oxide semiconductor film 926. The insulating film in contact with the oxide semiconductor film 926 may be a stack of insulating films each including a region where the proportion of oxygen is higher than that in the stoichiometric composition.

Note that in this embodiment, the transistor 902 has a top-gate structure. The transistor 902 includes a backgate electrode layer 923. With the backgate electrode layer, the transistor 902 can serve as a normally-off transistor. For example, when the potential of the backgate electrode layer 923 is set at GND or a fixed potential, the threshold voltage of the transistor 902 can shift further in a positive direction, which leads to the formation of a normally-off transistor.

In order to electrically connect the transistor 901 and the transistor 902 to form an electric circuit, one or more wiring layers for connecting these elements are stacked between layers and on the upper layer.

In FIG. 9, for example, one of the source and the drain of the transistor 901 is electrically connected to a wiring layer 914 through the contact plug 913. The other of the source and the drain of the transistor 901 is electrically connected to a wiring layer 916 through the contact plug 915. The gate of the transistor 901 is electrically connected to the drain electrode layer 928 of the transistor 902 through a contact plug 917, a wiring layer 918, a contact plug 921, a wiring layer 922, and a contact plug 925.

The wiring layers 914, 916, 918, and 922, and the backgate electrode layer 923 are embedded in insulating films. These wiring layers and the like are preferably formed using a low-resistance conductive material such as copper or aluminum. Alternatively, the wiring layers can be formed using graphene formed by CVD as a conductive material. Graphene is a one-atom thick sheet of $sp^2$-bonded carbon molecules or a stack of 2 to 100 sheets of the carbon molecules. Examples of a method of manufacturing such graphene are thermal CVD by which graphene is formed on a metal catalyst; and plasma CVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is independently formed, or may be formed in such a manner that a material of the barrier film is included in a wiring material and precipitated by heat treatment on the inner wall of an opening provided in an insulating film.

The insulating films 911, 912, 919, 920, and 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide prepared from $Si(OC_2H_5)_4$, hydrogen silsesquioxane (HSQ), methyl silsesquioxane (MSQ), organosilicate glass (OSG), or an organic polymer-based material. In particular, in the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. In addition, since CMP treatment is performed after the wirings are embedded in the insulating films, the insulating films need to have high mechanical strength. The insulating films can be made porous to have a lower dielectric constant as long as their mechanical strength can be secured. The insulating films are formed by sputtering, CVD, a coating method including spin coating (also referred to as spin on glass (SOG)), or the like.

An insulating film functioning as an etching stopper for planarization treatment by CMP or the like that is performed after the wiring material is embedded in the insulating films 911, 912, 919, 920, and 933 may be additionally provided.

Each of the contact plugs 913, 915, 917, 921, and 925 is formed in such a manner that an opening (a via hole) with a high aspect ratio is formed in the insulating film and is filled with a conductive material such as tungsten. The opening is formed preferably by highly anisotropic dry etching and particularly preferably by reactive ion etching (RIE). The inner wall of the opening is covered with a barrier film (diffusion prevention film) formed of a titanium film, a titanium nitride film, a stack of such films, or the like, and a material such as tungsten or polysilicon doped with phosphorus or the like fills the opening. For example, tungsten is embedded in the via hole by blanket CVD, and an upper surface of the contact plug is planarized by CMP.

Hydrogen or moisture is removed from the oxide semiconductor film of this embodiment by the dehydration treatment or the dehydrogenation treatment and oxygen vacancies therein are filled by the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier concentration thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have particularly favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, and further preferably $1\times10^{-24}$ A; or at 85° C., less than or equal to $1\times10^{-15}$ A, preferably $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

The drain electrode layer 928 can serve as the first electrode of the first capacitor C1, the second capacitor C2, or the like. In this case, an electrode layer formed in the same layer as the gate electrode layer 930 may be used as the second electrode of the capacitor. Further, as the first electrode of the capacitor, a film formed in the same layer as the oxide semiconductor film 926 or part of the oxide semiconductor film 926 may be used. The transistor 901 and the capacitor are preferably provided so that they overlap each other, because the occupation area of the semiconductor device can be reduced.

Alternatively, the wiring layer 918 or the wiring layer 922 may serve as the first electrode of the first capacitor C1 or the second capacitor C2. The transistor 902 and the capacitor are preferably provided so that they overlap each other, because the occupation area of the semiconductor device can be reduced.

The semiconductor device including the Si-Tr and the OS-Tr that is described in this embodiment is used for the semiconductor devices in other embodiments, whereby the operation speed can be improved. Further, the semiconductor device in which the Si-Tr and the OS-Tr are stacked, the semiconductor device in which the Si-Tr and the capacitor are stacked, or the semiconductor device in which the OS-Tr and the capacitor are stacked is used for the semiconductor devices in other embodiments, whereby the occupation area of the semiconductor device can be reduced. For example, it is particularly effective that the Si-Tr is used as Tr2, Tr3, Tr5, Tr6, TrA, TrB, TrC, TrD, or the like, and the OS-Tr is used as Tr1, Tr4, or the like.

Note that in this embodiment, the example in which the Si-Tr and the OS-Tr are stacked; however, the structure of the semiconductor device is not limited thereto, and the Si-Tr and the OS-Tr may be level with each other. Alternatively, the semiconductor device may be formed of only the OS-Tr or the Si-Tr illustrated in FIG. 9.

Further, in this embodiment, the transistor 901 and the transistor 902 each have a top-gate structure; however, these transistors may each have a bottom-gate structure, and any of transistors having a variety of structures such as a channel-etch type and a channel-protective type can be used. Note that the back-gate electrode layer 923 is not necessarily provided.

Part or the whole of this embodiment can be freely combined with part or the whole of another embodiment.

(Embodiment 10)

The semiconductor device of one embodiment of the present invention can be used for electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the semiconductor device of one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 10A to 10F illustrate specific examples of these electronic devices.

Figure 10A:
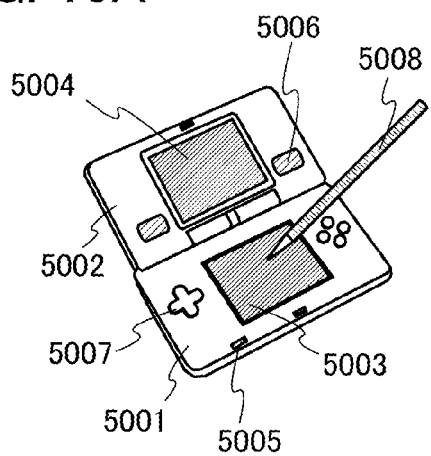

FIG. 10A illustrates a portable game console. The portable game console illustrated in FIG. 10A includes a housing 5001, a housing 5002, a display portion 5003, a display portion 5004, a microphone 5005, a speaker 5006, an operation key 5007, a stylus 5008, and the like. Note that although the portable game console illustrated in FIG. 10A has the two display portions 5003 and 5004, the number of display portions included in the portable game console is not limited to two.

Figure 10B:
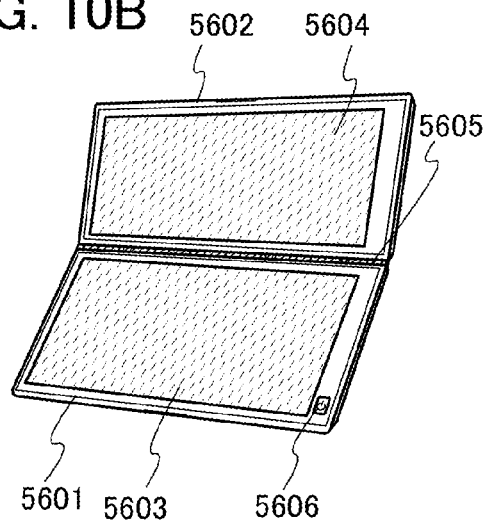

FIG. 10B illustrates a portable information terminal. The portable information terminal illustrated in FIG. 10B includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched depending on the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel area of a display device.

Figure 10C:
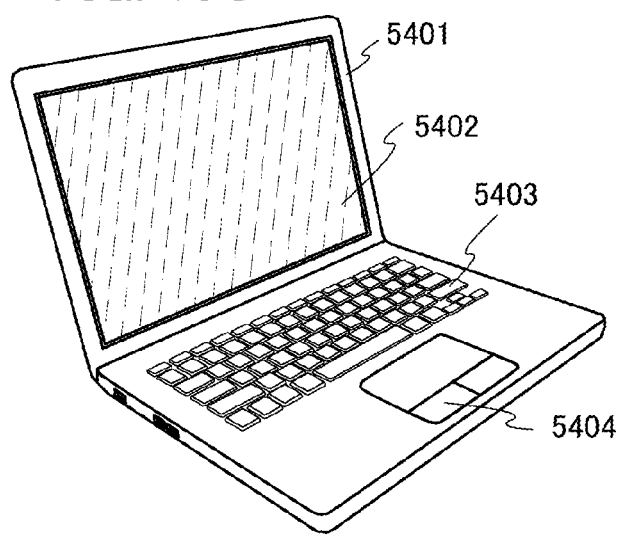

FIG. 10C illustrates a laptop personal computer. The laptop personal computer illustrated in FIG. 10C includes a housing 5401, a display portion 5402, a keyboard 5403, a pointing device 5404, and the like.

Figure 10D:
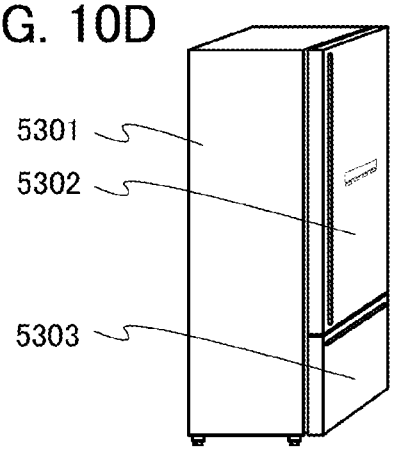

FIG. 10D illustrates an electric refrigerator-freezer. The electric refrigerator-freezer illustrated in FIG. 10D includes a housing 5301, a refrigerator door 5302, a freezer door 5303, and the like.

Figure 10E:
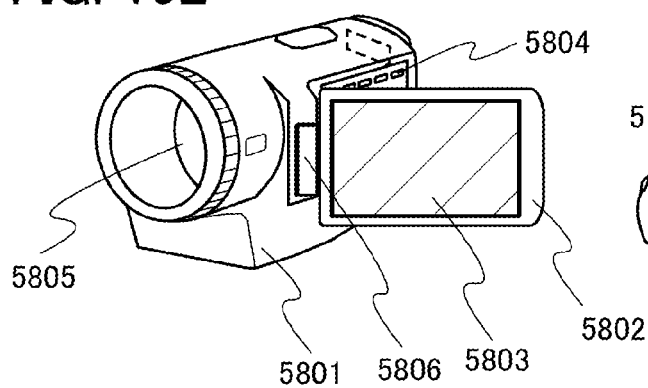

FIG. 10E illustrates a video camera. The video camera illustrated in FIG. 10E includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched depending on the angle at the joint 5806 between the first housing 5801 and the second housing 5802.

Figure 10F:
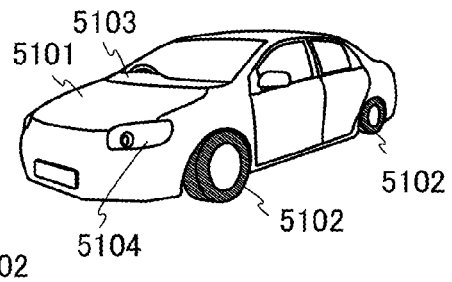

FIG. 10F illustrates a passenger car. The passenger car illustrated in FIG. 10F includes a car body 5101, wheels 5102, a dashboard 5103, lights 5104, and the like.

Part or the whole of this embodiment can be freely combined with part or the whole of another embodiment.

This application is based on Japanese Patent Application serial no. 2013-051283 filed with Japan Patent Office on Mar. 14, 2013, the entire contents of which are hereby incorporated by reference.

What is claimed is:

1. A semiconductor device comprising:
a first circuit portion comprising a first node and a second node;
a second circuit portion comprising a first transistor, a second transistor, a third transistor, a fourth transistor, a fifth transistor, a sixth transistor, a first capacitor, and a second capacitor; and
an insulating film over the second transistor, the third transistor, the fifth transistor, and the sixth transistor,
wherein a gate of the second transistor and a first electrode of the first capacitor are electrically connected to the first node through the first transistor,
wherein a gate of the fifth transistor and a first electrode of the second capacitor are electrically connected to the second node through the fourth transistor,
wherein one of a source and a drain of the second transistor is electrically connected to the second node through the third transistor,
wherein one of a source and a drain of the fifth transistor is electrically connected to the first node through the sixth transistor,
wherein the first transistor and the fourth transistor each include an oxide semiconductor including indium in a channel formation region, and
wherein the first transistor and the fourth transistor are provided over the insulating film.

2. The semiconductor device according to claim 1, wherein the first circuit portion includes an even number of inverter circuits circularly connected to each other.

3. The semiconductor device according to claim 1, wherein the second transistor, the third transistor, the fifth transistor, and the sixth transistor each include silicon in a channel formation region.

4. The semiconductor device according to claim 3, wherein the second transistor and the fifth transistor have n-type conductivity.

5. A semiconductor device comprising:
a first circuit portion comprising a first node and a second node;
a second circuit portion comprising a first transistor, a second transistor, a third transistor, a fourth transistor, a fifth transistor, a sixth transistor, a first capacitor, and a second capacitor and
an insulating film over the second transistor, the third transistor, the fifth transistor and the sixth transistor,
wherein a gate of the second transistor and a first electrode of the first capacitor are electrically connected to the first node through the first transistor,
wherein a gate of the fifth transistor and a first electrode of the second capacitor are electrically connected to the second node through the fourth transistor,
wherein one of a source and a drain of the second transistor is electrically connected to the first node through the third transistor,
wherein one of a source and a drain of the fifth transistor is electrically connected to the second node through the sixth transistor,
wherein the first transistor and the fourth transistor each include an oxide semiconductor including indium in a channel formation region, and
wherein the first transistor and the fourth transistor are provided over the insulating film.

6. The semiconductor device according to claim 5, wherein the first circuit portion includes an even number of inverter circuits circularly connected to each other.

7. The semiconductor device according to claim 5, wherein the second transistor, the third transistor, the fifth transistor and the sixth transistor each include silicon in a channel formation region.

8. The semiconductor device according to claim 7, wherein the second transistor and the fifth transistor have p-type conductivity.

9. A semiconductor device comprising:
a first circuit portion comprising a first node and a second node;
a second circuit portion comprising a first transistor, a second transistor, a third transistor, a fourth transistor, a first capacitor, and a second capacitor; and
an insulating film over the second transistor and the fourth transistor,
wherein a gate of the second transistor and a first electrode of the first capacitor are electrically connected to the first node through the first transistor,
wherein a gate of the fourth transistor and a first electrode of the second capacitor are electrically connected to the second node through the third transistor,
wherein one of a source and a drain of the second transistor is electrically connected to the second node,
wherein one of a source and a drain of the fourth transistor is electrically connected to the first node,
wherein the first transistor and the third transistor each include an oxide semiconductor including indium in a channel formation region, and
wherein the first transistor and the third transistor are provided over the insulating film.

10. The semiconductor device according to claim 9, wherein the first circuit portion includes an even number of inverter circuits circularly connected to each other.

11. The semiconductor device according to claim 9, wherein the second transistor and the fourth transistor each include silicon in a channel formation region.

12. The semiconductor device according to claim 11, wherein the second transistor and the fourth transistor have n-type conductivity.

* * * * *